(12) United States Patent
Ogata et al.

(10) Patent No.: US 12,215,259 B2
(45) Date of Patent: Feb. 4, 2025

(54) MULTILAYER OBJECT AND RELEASE AGENT COMPOSITION

(71) Applicant: NISSAN CHEMICAL CORPORATION, Tokyo (JP)

(72) Inventors: Hiroto Ogata, Toyama (JP); Tetsuya Shinjo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 347 days.

(21) Appl. No.: 17/801,016

(22) PCT Filed: Feb. 16, 2021

(86) PCT No.: PCT/JP2021/005699
§ 371 (c)(1),
(2) Date: Aug. 19, 2022

(87) PCT Pub. No.: WO2021/166905
PCT Pub. Date: Aug. 26, 2021

(65) Prior Publication Data
US 2023/0143007 A1 May 11, 2023

(30) Foreign Application Priority Data
Feb. 21, 2020 (JP) .................. 2020-028187

(51) Int. Cl.
| | |
|---|---|
| B32B 7/12 | (2006.01) |
| C08J 7/12 | (2006.01) |
| C09J 7/38 | (2018.01) |
| C09J 7/40 | (2018.01) |
| C09J 183/04 | (2006.01) |
| B32B 9/00 | (2006.01) |
| B32B 17/06 | (2006.01) |
| H01L 21/683 | (2006.01) |

(52) U.S. Cl.
CPC .............. *C09J 7/401* (2018.01); *B32B 7/12* (2013.01); *C08J 7/12* (2013.01); *C09J 7/38* (2018.01); *C09J 183/04* (2013.01); *B32B 9/005* (2013.01); *B32B 17/06* (2013.01); *B32B 2255/26* (2013.01); *B32B 2307/202* (2013.01); *B32B 2307/412* (2013.01); *B32B 2307/748* (2013.01); *C09J 2203/326* (2013.01); *C09J 2483/00* (2013.01); *H01L 21/6836* (2013.01)

(58) Field of Classification Search
CPC .............. B32B 7/06; B32B 7/12; C09J 7/401
See application file for complete search history.

(56) References Cited

U.S. PATENT DOCUMENTS

| | | | |
|---|---|---|---|
| 4,737,389 A | 4/1988 | Hartsing, Jr. et al. | |
| 2012/0100377 A1 | 4/2012 | Seidel et al. | |
| 2012/0115084 A1 | 5/2012 | Okuyama et al. | |
| 2014/0311680 A1 | 10/2014 | Kubo et al. | |
| 2016/0332421 A1* | 11/2016 | Yoshioka | B32B 7/12 |
| 2023/0265325 A1* | 8/2023 | Yanai | C08K 5/56 |
| | | | 156/712 |
| 2024/0199924 A1* | 6/2024 | Moriya | C09J 7/401 |

FOREIGN PATENT DOCUMENTS

| | | |
|---|---|---|
| JP | 2004-64040 A | 2/2004 |
| JP | 2008-216530 A | 9/2008 |
| JP | 2012-503046 A | 2/2012 |
| JP | 2012-106486 A | 6/2012 |

OTHER PUBLICATIONS

ISR for PCT/JP2021/005699, dated May 25, 2021 (w/ translation).
Written Opinion for PCT/JP2021/005699, dated May 25, 2021 (w/ translation).
ESR for EP App. No. 21 75 7405.2, dated Mar. 11, 2024.

* cited by examiner

*Primary Examiner* — Elizabeth E Mulvaney
(74) *Attorney, Agent, or Firm* — Greenblum & Bernstein, P.L.C.

(57) ABSTRACT

The invention provides a laminate having a first substrate formed of a semiconductor substrate; a second substrate formed of a light-transmissive support substrate; and an adhesive layer and a release layer disposed between the first substrate and the second substrate, characterized in that the release layer is a film formed from a releasing agent composition containing a polynuclear phenol derivative represented by formula (P) (wherein Ar represents an arylene group), a cross-linking agent, and at least one of an acid generator and an acid.

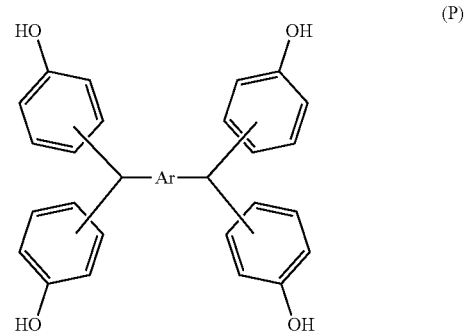

20 Claims, No Drawings

MULTILAYER OBJECT AND RELEASE AGENT COMPOSITION

TECHNICAL FIELD

The present invention relates to a laminate and to a releasing agent composition.

BACKGROUND ART

Conventionally, electronic elements and wires are 2-dimensionally (within a plane) integrated on a semiconductor wafer. In a trend toward further integration, demand has arisen for a semiconductor integration technique which achieves 3-dimensional integration (i.e., stacking) in addition to 2-dimensional integration. In the technique of 3-dimensional integration, a number of layers are stacked with wire connection by the mediation of through silicon vias (TSVs). In integration of multiple layers, each component wafer to be stacked is thinned by polishing (i.e., grinding) a surface opposite the circuit-furnished surface (i.e., a back surface), and the thus-thinned semiconductor wafers are stacked.

Before thinning, the semiconductor wafer (may also be called simply "wafer") is fixed to a support for facilitating polishing by means of a polishing machine (i.e., grinder). Since the fixation must be easily removed after polishing, the fixation is called temporary bonding. Temporary bonding must be easily removed from the support. When such temporary bonding is removed by excessive force, in some cases a thinned semiconductor wafer may be broken or deformed. In order to prevent such a phenomenon, the temporarily bonded support is detached in a gentle manner. However, from another aspect, it is not preferred that the temporarily bonded support be removed or slid by a stress applied during polishing of the back surface of the semiconductor wafer. Therefore, temporary bonding must withstand the stress during polishing and must be easily removed after polishing.

For example, one required performance includes having high stress (i.e., strong adhesion) within the plane direction during polishing and low stress (i.e., weak adhesion) toward the thickness direction during detaching.

In relation to such a bonding/debonding process, techniques employing laser light radiation are disclosed (see, for example, Patent Documents 1 and 2). However, with further progress in the current industrial field of semiconductors, there is continuous demand for a new debonding technique employing laser light radiation.

PRIOR ART DOCUMENTS

Patent Documents

Patent Document 1: Japanese Patent Application Laid-Open (kokai) No. 2004-64040

Patent Document 2: Japanese Patent Application Laid-Open (kokai) No. 2012-106486

SUMMARY OF THE INVENTION

Problems to be Solved by the Invention

The present invention has been conceived under such circumstances. Thus, an object of the present invention is to provide a laminate having a release layer which exhibits excellent heat resistance during bonding between a support substrate and a semiconductor substrate, processing of the back surface of the semiconductor substrate, and a device-mounting process or a like process, and which can be easily debonded through irradiation with light during removal of the support substrate or the semiconductor substrate. Another object of the present invention is to provide a releasing agent composition which provides a film suitably serving as such a release layer.

Means for Solving the Problems

The present inventors have conducted extensive studies for solving the aforementioned problems, and as a result have found that the problems can be solved by providing a laminate having a first substrate formed of a semiconductor substrate, a second substrate formed of a light-transmissive support substrate, and an adhesive layer and a release layer disposed between the first substrate and the second substrate, wherein the release layer is a film formed from a releasing agent composition containing a specific polynuclear phenol derivative, a cross-linking agent, and at least one of an acid generator and an acid. The present invention has been accomplished on the basis of this finding.

Accordingly, the present invention provides the following:

1. A laminate comprising:

a first substrate formed of a semiconductor substrate;

a second substrate formed of a light-transmissive support substrate; and an adhesive layer and a release layer disposed between the first substrate and the second substrate, characterized in that the release layer is a film formed from a releasing agent composition containing a polynuclear phenol derivative represented by formula (P):

[F1]

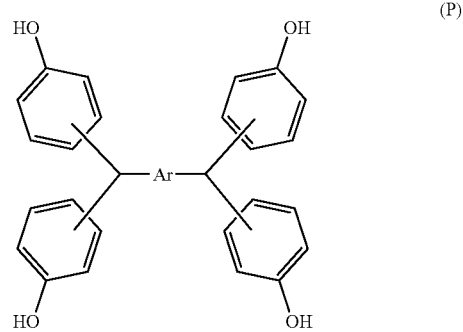

(wherein Ar represents an arylene group), a cross-linking agent, and at least one of an acid generator and an acid.

2. A laminate according to 1 above, wherein the polynuclear phenol derivative is represented by formula (P-1):

[F2]

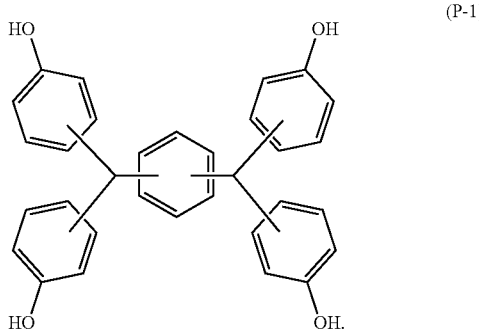

(P-1)

3. A laminate according to 2 above, wherein the polynuclear phenol derivative is represented by formula (P-1-1):

[F3]

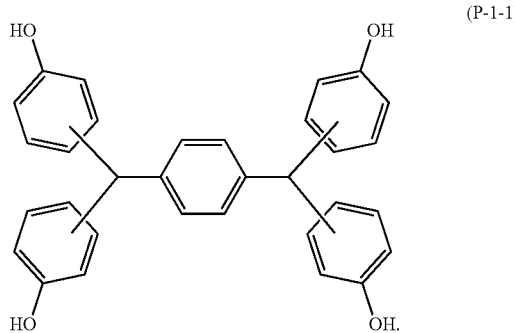

(P-1-1)

4. A laminate according to 3 above, wherein the polynuclear phenol derivative is represented by formula (P1):

[F4]

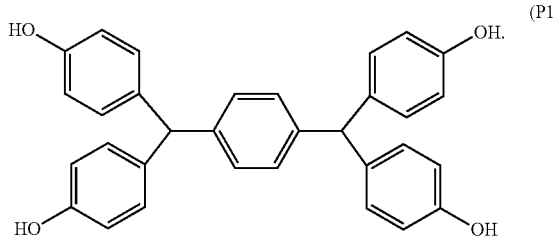

(P1)

5. A laminate according to any of 1 to 4 above, wherein the cross-linking agent includes at least one species selected from among a phenolic cross-linking agent having a crosslink-forming group, a melamine cross-linking agent having a crosslink-forming group, a urea cross-linking agent having a crosslink-forming group, and a thiourea cross-linking agent having a crosslink-forming group.

6. A laminate according to 5 above, wherein the cross-linking agent contains a phenolic cross-linking agent having a crosslink-forming group.

7. A laminate according to any of 1 to 6 above, wherein the releasing agent composition contains an acid.

8. A laminate according to 7 above, wherein the acid includes at least one species selected from among an arylsulfonic acid, an arylsulfonic acid salt, an arylcarboxylic acid, an arylcarboxylic acid salt, a chain or cyclic alkylsulfonic acid, a chain or cyclic alkylsulfonic acid salt, a chain or cyclic alkylcarboxylic acid, and a chain or cyclic alkylcarboxylic acid.

9. A laminate according to any of 1 to 8 above, wherein the adhesive layer is a film formed from an adhesive composition containing an adhesive component (S) containing at least one species selected from among a silicone adhesive, an acrylic resin adhesive, an epoxy resin adhesive, a polyamide adhesive, a polystyrene adhesive, a polyimide adhesive, and a phenolic resin adhesive.

10. A laminate according to 9 above, wherein the adhesive component (S) contains a silicone adhesive.

11. A laminate according to 10 above, wherein the silicone adhesive contains a polysiloxane component (A) that is cured through hydrosilylation.

12. A releasing agent composition containing a polynuclear phenol derivative represented by formula (P):

[F5]

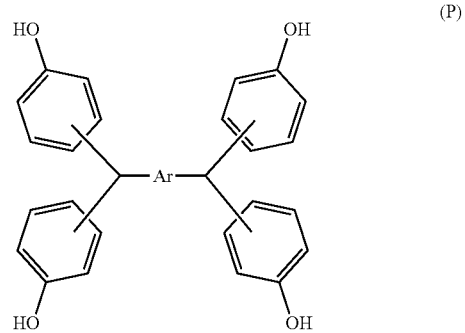

(P)

(wherein Ar represents an arylene group), a cross-linking agent, and at least one of an acid generator and an acid.

13. A releasing agent composition according to 12 above, wherein the polynuclear phenol derivative is represented by formula (P-1):

[F6]

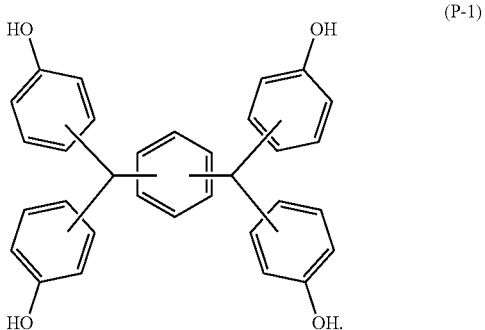

(P-1)

14. A releasing agent composition according to 13 above, wherein the polynuclear phenol derivative is represented by formula (P-1-1):

[F7]

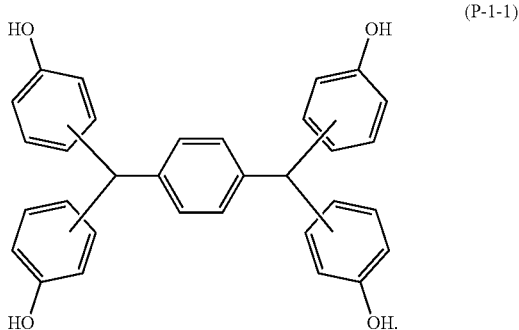

(P-1-1)

15. A releasing agent composition according to 14 above, wherein the polynuclear phenol derivative is represented by formula (P1):

[F8]

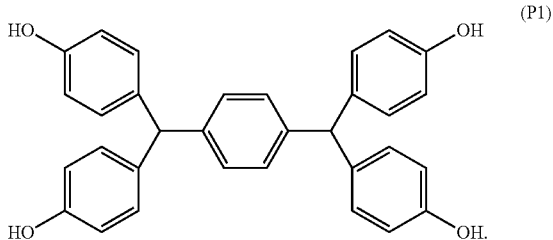

(P1)

16. A releasing agent composition according to any of 12 to 15 above, wherein the cross-linking agent includes at least one species selected from among a phenolic cross-linking agent having a crosslink-forming group, a melamine cross-linking agent having a crosslink-forming group, a urea cross-linking agent having a crosslink-forming group, and a thiourea cross-linking agent having a crosslink-forming group.

17. A releasing agent composition according to any of 12 to 16 above, wherein the cross-linking agent contains a phenolic cross-linking agent having a crosslink-forming group.

18. A releasing agent composition according to any of 12 to 17 above, wherein the releasing agent composition contains an acid.

19. A releasing agent composition according to 18 above, wherein the acid includes at least one species selected from among an arylsulfonic acid, an arylsulfonic acid salt, an arylcarboxylic acid, an arylcarboxylic acid salt, a chain or cyclic alkylsulfonic acid, a chain or cyclic alkylsulfonic acid salt, a chain or cyclic alkylcarboxylic acid, and a chain or cyclic alkylcarboxylic acid.

20. A releasing agent composition according to any of 12 to 19 above, the releasing agent composition used for forming a release layer of a laminate, the laminate having a first substrate formed of a semiconductor substrate; a second substrate formed of a light-transmissive support substrate; and an adhesive layer and the release layer disposed between the first substrate and the second substrate.

Effects of the Invention

The laminate of the present invention includes a first substrate formed of a semiconductor substrate; a second substrate formed of a light-transmissive support substrate; and an adhesive layer and a release layer disposed between the first substrate and the second substrate, wherein the release layer is a film formed from a releasing agent composition containing a specific polynuclear phenol derivative, a cross-linking agent, and at least one of an acid generator and an acid. When the laminate is irradiated with light from the second substrate side, the release layer that has received light exerts debonding property, and thus the second substrate can be readily debonded from the first substrate and the adhesive layer. The conceivable reason why the second substrate can be readily debonded is that the release layer decomposes or denatures through absorption of the irradiated light passing through the second substrate. Conceivably, such decomposition or denaturation causes debonding to occur at the interface between the release layer and the adhesive layer, at the interface between the release layer and the support substrate, or from the release layer.

The laminate of the present invention has the aforementioned characteristic feature. Thus, when, for example, the back surface of the first substrate (i.e., wafer) is processed, the processed wafer can be readily debonded from the second substrate (i.e., support substrate) by irradiating the laminate with laser light from the second substrate side. Therefore, imposition of mechanical stress on the wafer can be avoided, thereby preventing damage to the wafer (e.g., warpage or deformation of the wafer). In addition, when the release layer included in the laminate of the present invention exhibits debonding property, considerable generation of gas or heat, which may cause adverse effects, can be prevented, and thus the release layer less affects the first substrate formed of the semiconductor substrate. Therefore, when the laminate of the present invention is used, production of a more reliable semiconductor device is expected.

The releasing agent composition of the present invention contains a cross-linking agent, at least one of an acid generator and an acid, and a specific polynuclear phenol derivative exhibiting excellent solubility in an organic solvent. Thus, a film formed from the composition effectively absorbs light. Therefore, when the film formed from the releasing agent composition of the present invention (serving as a release layer) and an adhesive layer are disposed between a first substrate formed of a semiconductor substrate and a second substrate formed of a light-transmissive support substrate, to thereby produce a laminate, the semiconductor substrate, etc. can be debonded from the support substrate by irradiating the laminate with light (e.g., laser light) without application of an excessive load for debonding of a workpiece (e.g., the support substrate or the semiconductor substrate).

Furthermore, the releasing agent composition of the present invention is less likely to undergo a change in color or coloration with the passage of time, and exhibits excellent storage stability. Therefore, for example, the releasing agent composition can be produced and stored in a larger amount than ever before, and accordingly efficient use can be made of a production facility for the composition. Thus, the invention would reduce the production cost of the releasing agent composition and the cost of a semiconductor device produced from the composition.

MODES FOR CARRYING OUT THE INVENTION

The laminate of the present invention includes a first substrate formed of a semiconductor substrate; a second substrate formed of a light-transmissive support substrate; and an adhesive layer and a release layer disposed between the first substrate and the second substrate, wherein the release layer is a film formed from a releasing agent composition containing a polynuclear phenol derivative represented by formula (P):

[F9]

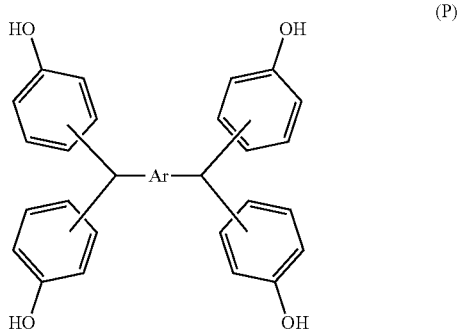

(wherein Ar represents a C6 to C60 arylene group), a cross-linking agent, and at least one of an acid generator and an acid.

The first substrate formed of the semiconductor substrate is, for example, a wafer. Specific examples of the first substrate include, but are not limited to, a glass wafer or silicon wafer having a diameter of about 300 mm and a thickness of about 770 μm.

The second substrate formed of the support substrate is a support (carrier) that is bonded for supporting the first substrate. No particular limitation is imposed on the second substrate, so long as it has light-transmissibility. Specific examples of the second substrate include, but are not limited to, a glass wafer having a diameter of about 300 mm and a thickness of about 700 μm.

The light-transmissive support substrate has a transmittance of generally 50% or more, preferably 60% or more, more preferably 70% or more, still more preferably 80% or more, much more preferably 90% or more.

The light-transmissive support substrate is typically a substrate that allows passage of laser light. The wavelength of the laser light is generally 190 nm to 600 nm. The lower limit of the wavelength is 250 nm in a certain embodiment, and is 300 nm in another embodiment. The upper limit of the wavelength is 580 nm in a certain embodiment, and is 560 nm in another embodiment. The laminate of the present invention can achieve effective debonding by use of laser light having a wavelength of 308 nm, 343 nm, 355 nm, or 532 nm.

In one preferred embodiment, the laminate of the present invention includes a first substrate formed of a semiconductor substrate; a second substrate formed of a light-transmissive support substrate; an adhesive layer provided between the first substrate and the second substrate so as to be in contact with the first substrate; and a release layer provided so as to be in contact with the second substrate and the adhesive layer.

The laminate of the present invention can achieve debonding by irradiating the release layer with, for example, laser light from the light-transmissive second substrate side without application of an excessive load for debonding. As used herein, the expression "can be debonded" or "peelable" refers to a state of relatively lower bonding strength. In other words, it means excellent peelability for ensuring easy debonding. The bonding strength of the release layer included in the laminate of the present invention is reduced through irradiation with, for example, laser light, as compared with that in the stage before irradiation. Thus, in the laminate of the present invention, for example, the first substrate formed of the wafer is suitably supported by the second substrate formed of the laser light-transmissive support substrate via the adhesive layer and the release layer during processing (e.g., thinning) of the wafer. After completion of the processing, when the laminate is irradiated with laser light from the second substrate side, the release layer absorbs laser light-transmitting through the second substrate, and thus debonding occurs at the interface between the release layer and the adhesive layer, at the interface between the release layer and the support substrate, or from the release layer. Consequently, the first substrate can be effectively debonded without application of an excessive load to debonding.

As described above, the release layer included in the laminate of the present invention is a film formed from a releasing agent composition containing a polynuclear phenol derivative represented by formula (P), a cross-linking agent, and at least one of an acid generator and an acid.

[F10]

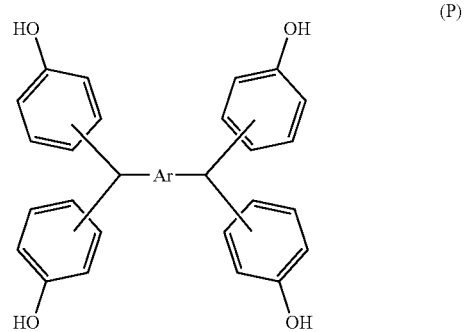

In formula (P), Ar represents an arylene group. No particular limitation is imposed on the number of carbon atoms of the arylene group, and the number is generally 6 to 60. From the viewpoints of preparing a releasing agent composition having excellent homogeneity and forming a release layer having high flatness at high reproducibility, the number of carbon atoms is preferably 30 or less, more preferably 20 or less, still more preferably 18 or less, much more preferably 12 or less.

Specific examples of the arylene group include, but are not limited to, 1,2-phenylene, 1,3-phenylene, and 1,4-phenylene; groups derived through removal of two hydrogen atoms on an aromatic ring of a condensed-ring aromatic hydrocarbon compound, such as 1,5-naphthalenediyl, 1,8-naphthalenediyl, 2,6-naphthalenediyl, 2,7-naphthalenediyl, 1,2-anthracenediyl, 1,3-anthracenediyl, 1,4-anthracenediyl, 1,5-anthracenediyl, 1,6-anthracenediyl, 1,7-anthracenediyl, 1,8-anthracenediyl, 2,3-anthracenediyl, 2,6-anthracenediyl, 2,7-anthracenediyl, 2,9-anthracenediyl, 2,10-anthracenediyl, and 9,10-anthracenediyl; and groups derived through removal of two hydrogen atoms of an aromatic ring belonging to a ring-linked aromatic hydrocarbon compound, such as biphenyl-4,4'-diyl and p-terphenyl-4,4''-diyl.

From the viewpoints of forming a release layer exhibiting good debonding property and producing, at high reproducibility, a laminate from which a support substrate can be effectively debonded, the polynuclear phenol derivative represented by formula (P) is preferably a polynuclear phenol derivative represented by formula (P-1), more preferably a polynuclear phenol derivative represented by formula (P-1-1), still more preferably a polynuclear phenol derivative represented by formula (P1).

[F11]

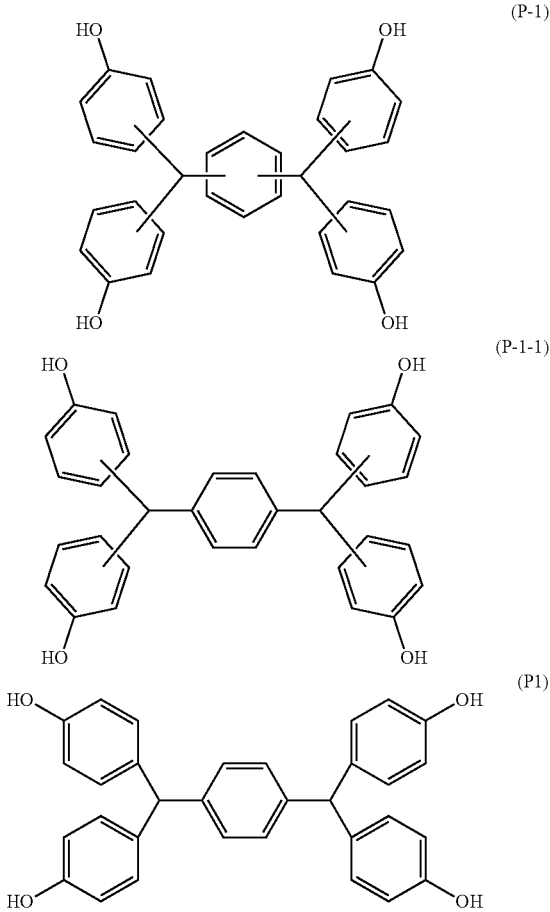

The aforementioned releasing agent composition contains a cross-linking agent.

No particular limitation is imposed on the cross-linking agent, so long as it can cross-link with the aforementioned polynuclear phenol derivative. Specific examples of the cross-linking agent include a phenolic cross-linking agent, a melamine cross-linking agent, a urea cross-linking agent, and a thiourea cross-linking agent, each of which contains, in the molecule thereof, a crosslink-forming group such as an alkoxymethyl group (e.g., hydroxymethyl, methoxymethyl, or butoxymethyl). Such a cross-linking agent may be a low-molecular-weight compound or a polymer compound.

The cross-linking agent contained in the releasing agent composition generally has two or more crosslink-forming groups. From the viewpoint of achieving more suitable curing at high reproducibility, the number of crosslink-forming groups contained in the compound serving as the cross-linking agent is preferably 2 to 10, more preferably 2 to 6.

From the viewpoint of achieving higher heat resistance, the cross-linking agent contained in the releasing agent composition preferably has an aromatic ring (e.g., benzene ring or naphthalene ring) in the molecule thereof. Typical examples of such a cross-linking agent include, but are not limited to, a phenolic cross-linking agent.

The phenolic cross-linking agent having a crosslink-forming group is a compound having a crosslink-forming group bonded to an aromatic ring and having at least one of a phenolic hydroxyl group and an alkoxy group derived from a phenolic hydroxyl group. Examples of the alkoxy group derived from a phenolic hydroxyl group include, but are not limited to, a methoxy group and a butoxy group.

The aromatic ring bonded to the crosslink-forming group or the aromatic ring bonded to a phenolic hydroxyl group and/or an alkoxy group derived from a phenolic hydroxyl group may be a non-condensed aromatic ring such as a benzene ring, or may be a condensed aromatic ring such as a naphthalene ring or an anthracene ring.

When the phenolic cross-linking agent has a plurality of aromatic rings in the molecule thereof, the crosslink-forming group and a phenolic hydroxyl group and/or an alkoxy group derived from a phenolic hydroxyl group may be bonded to the same aromatic ring or different aromatic rings in the molecule of the phenolic cross-linking agent.

The aromatic ring bonded to the crosslink-forming group or a phenolic hydroxyl group and/or an alkoxy group derived from a phenolic hydroxyl group may be further substituted with, for example, an alkyl group (e.g., methyl, ethyl, or butyl), a hydrocarbon group such as an aryl group (e.g., phenyl), or a halogen atom (e.g., fluorine).

Specific examples of the phenolic cross-linking agent having a crosslink-forming group include compounds represented by any of formulae (L1) to (L4).

[F12]

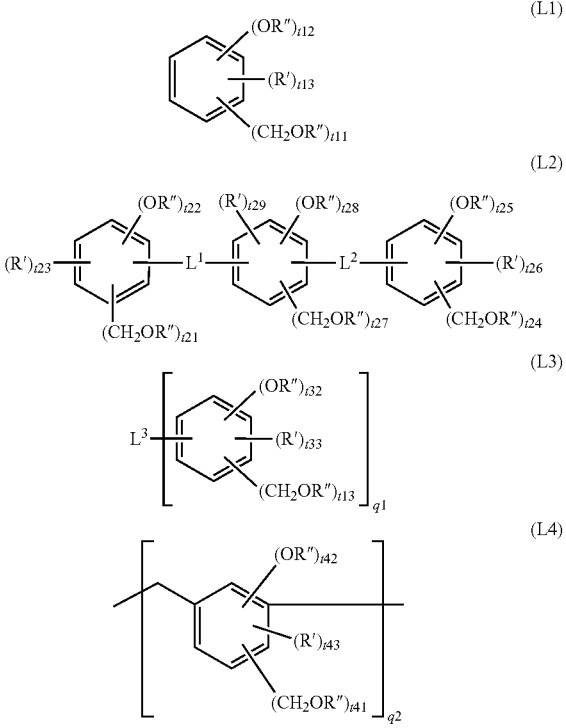

In the aforementioned formulae, R' independently represents a fluorine atom, an aryl group, or an alkyl group; R"

independently represents a hydrogen atom or an alkyl group; each of $L^1$ and $L^2$ independently represents a single bond, a methylene group, or a propane-2, 2-diyl group; $L^3$, which is determined depending on q1, represents a single bond, a methylene group, a propane-2, 2-diyl group, a methanetriyl group, or an ethane-1, 1, 1-triyl group; t11, t12, and t13 are integers satisfying the following relations: $2 \leq t11 \leq 5$, $1 \leq t12 \leq 4$, $0 \leq t13 \leq 3$, and $t11+t12+t13 \leq 6$; t21, t22, and t23 are integers satisfying the following relations: $2 \leq t21 \leq 4$, $1 \leq t22 \leq 3$, $0 \leq t23 \leq 2$, and $t21+t22+t23 \leq 5$; t24, t25, and t26 are integers satisfying the following relations: $2 \leq t24 \leq 4$, $1 \leq t25 \leq 3$, $0 \leq t26 \leq 2$, and $t24+t25+t26 \leq 5$; t27, t28, and t29 are integers satisfying the following relations: $0 \leq t27 \leq 4$, $0 \leq t28 \leq 4$, $0 \leq t29 \leq 4$, and $t24+t25+t26 \leq 4$; t31, t32, and t33 are integers satisfying the following relations: $2 \leq t31 \leq 4$, $1 \leq t32 \leq 3$, $0 \leq t33 \leq 2$, and $t31+t32+t33 \leq 5$; t41, 42, and t43 are integers satisfying the following relations: $2 \leq t41 \leq 3$, $1 \leq t42 \leq 2$, $0 \leq t43 \leq 1$, and $t41+t42+t43 \leq 4$; q1 is 2 or 3; and q2, which represents the number of repetitions, is an integer of 0 or more. Specific examples of the aforementioned aryl group and alkyl group are the same as those described below. The aryl group is preferably a phenyl group, and the alkyl group is preferably a methyl group or a t-butyl group.

Specific examples of the compounds represented by formulae (L1) to (L4) include, but are not limited to, those described below. Such a compound may be synthesized through any known method, or may be a commercial product of, for example, ASAHI YUKIZAI CORPORATION or Honshu Chemical Industry Co., Ltd.

[F13]

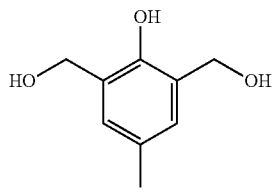

(L1)

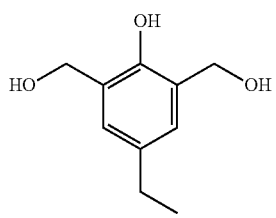

(L2)

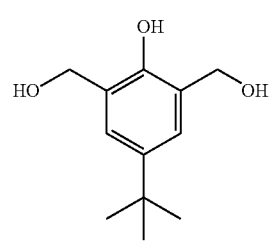

(L3)

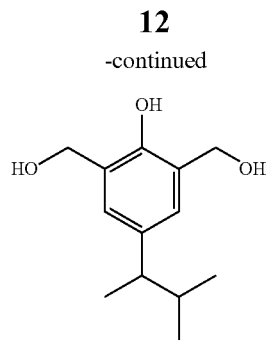

(L4)

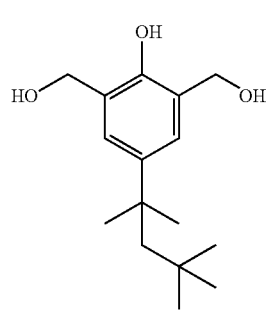

(L5)

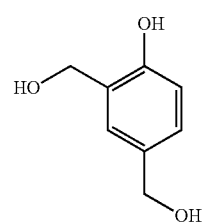

(L6)

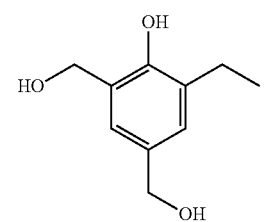

(L7)

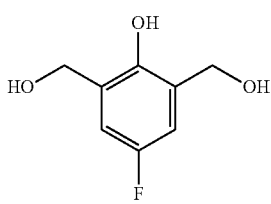

(L8)

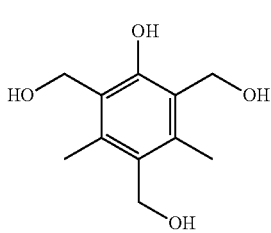

(L9)

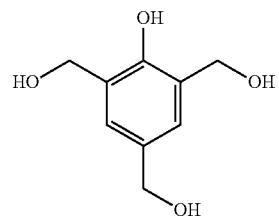 (L10)
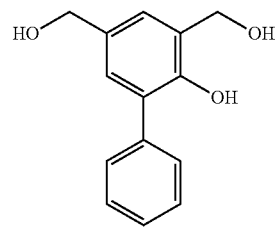 (L11)
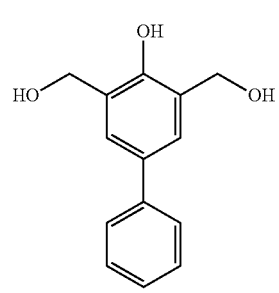 (L12)
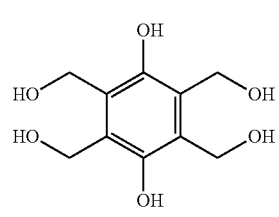 (L13)
[F14]
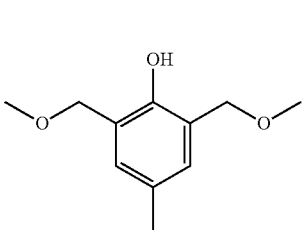 (L1M)
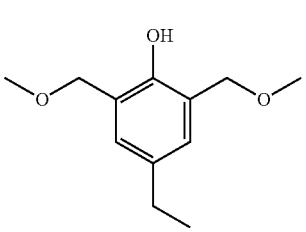 (L2M)
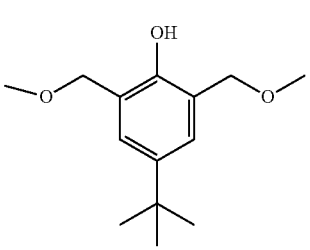 (L3M)
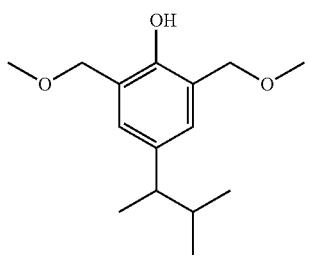 (L4M)
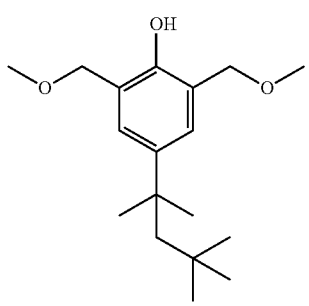 (L5M)
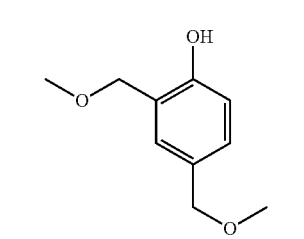 (L6M)
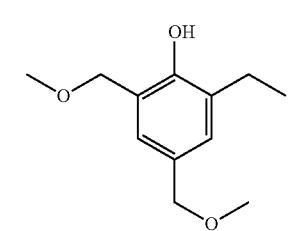 (L7M)
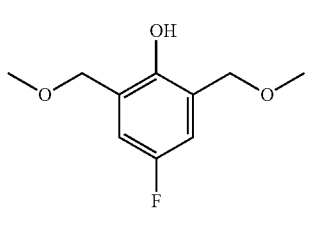 (L8M)
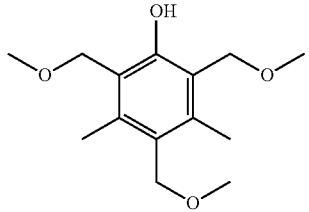 (L9M)

(L10M) 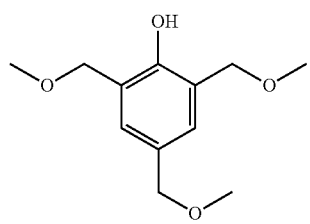
(L11M) 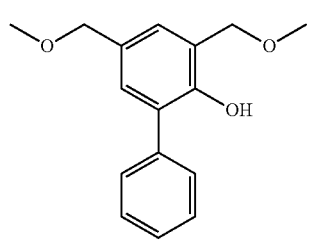
(L12M) 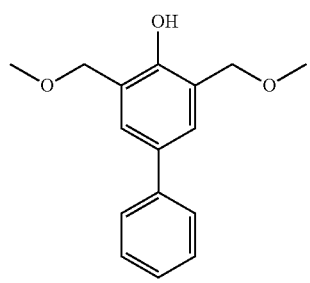
(L13M) 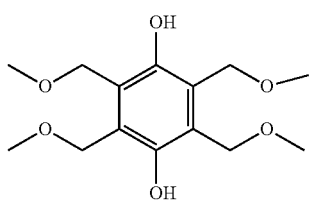
[F15]
(L14) 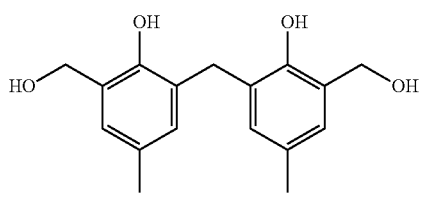
(L15) 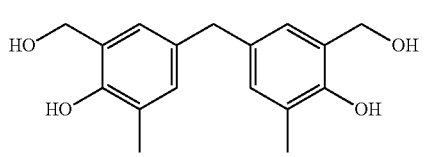
(L16) 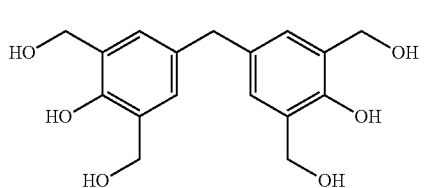
(L17) 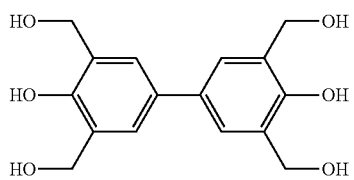
(L18) 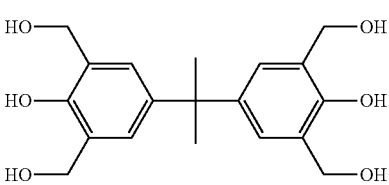
(L19) 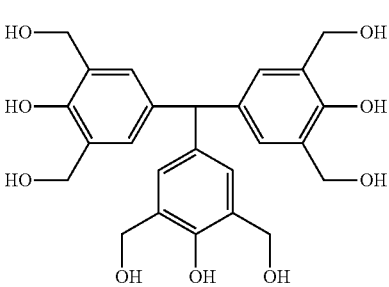
(L20) 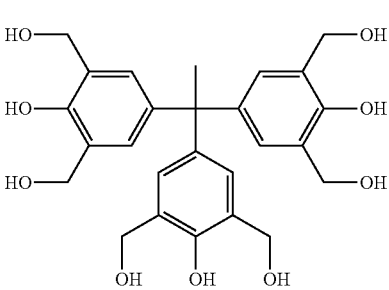
(L21) 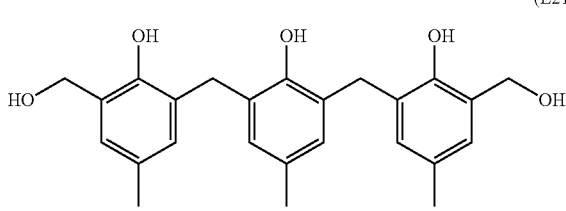
(L22) 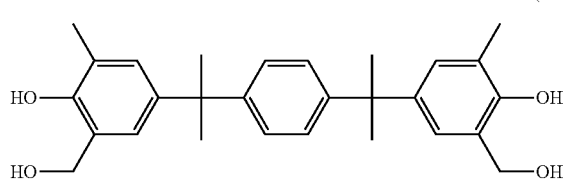
[F16]
(L14M) 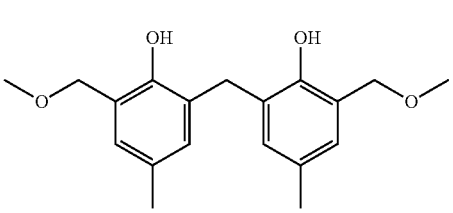

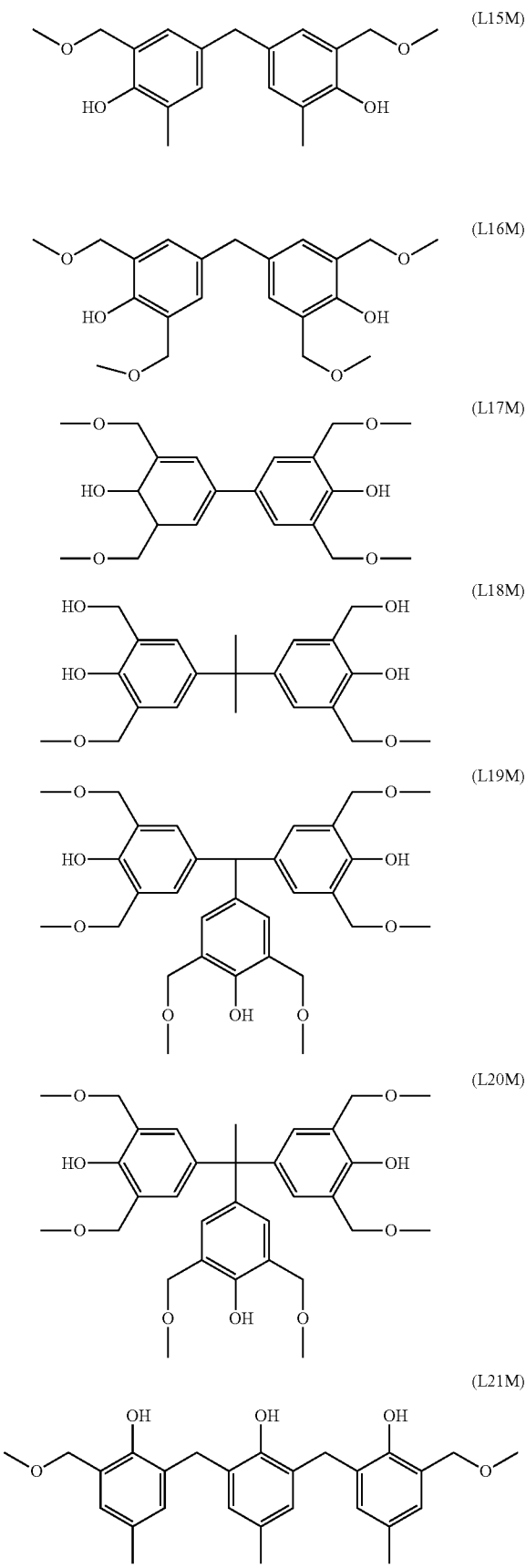

The melamine cross-linking agent having a crosslink-forming group is a melamine derivative, 2,4-diamino-1,3,5-triazine derivative, or 2-amino-1,3,5-triazine derivative wherein at least one hydrogen atom of an amino group bonded to the triazine ring is substituted with a crosslink-forming group. The triazine ring may further have a substituent such as an aryl group (e.g., phenyl).

Specific examples of the melamine cross-linking agent having a crosslink-forming group include, but are not limited to, mono-, bis-, tris-, tetrakis-, pentakis-, or hexakis-alkoxymethylmelamines, such as N,N,N',N',N'',N''-hexakis(methoxymethyl)melamine and N,N,N',N',N'',N''-hexakis(butoxymethyl)melamine; and mono-, bis-, tris-, or tetrakis-alkoxymethylbenzoguanamines, such as N,N,N',N'-tetrakis(methoxymethyl)benzoguanamine and N,N,N',N'-tetrakis(butoxymethyl)benzoguanamine.

The urea cross-linking agent having a crosslink-forming group is a urea-bond-containing compound derivative having a structure in which at least one hydrogen atom of the NH groups forming the urea bond is substituted with a crosslink-forming group.

Specific examples of the urea cross-linking agent having a crosslink-forming group include, but are not limited to, mono-, bis-, tris-, or tetrakis-alkoxymethylglycolurils, such as 1,3,4,6-tetrakis(methoxymethyl)glycoluril and 1,3,4,6-tetrakis(butoxymethyl)glycoluril; and mono-, bis-, tris-, or tetrakis-alkoxymethylureas, such as 1,3-bis(methoxymethyl)urea and 1,1,3,3-tetrakismethoxymethylurea.

The thiourea cross-linking agent having a crosslink-forming group is a thiourea-bond-containing compound derivative having a structure in which at least one hydrogen atom of the NH groups forming the thiourea bond is substituted with a crosslink-forming group.

Specific examples of the thiourea cross-linking agent having a crosslink-forming group include, but are not limited to, mono-, bis-, tris-, or tetrakis-alkoxymethylthiourea compounds, such as 1,3-bis(methoxymethyl)thiourea and 1,1,3,3-tetrakismethoxymethylthiourea.

The amount of the cross-linking agent contained in the releasing agent composition cannot unequivocally be determined, since the amount varies depending on, for example, the application method to be employed, or a desired film thickness. The amount of the cross-linking agent is generally 0.001 to 80 mass % relative to the film-forming components. From the viewpoints of achieving suitable curing and producing, at high reproducibility, a laminate from which a support substrate can be effectively debonded, the amount of the cross-linking agent is preferably 0.01 mass % or more, more preferably 0.05 mass % or more, still more preferably 0.5 mass % or more, much more preferably 1.0 mass % or more, and is preferably 50 mass % or less, more preferably 40 mass % or less, still more preferably 20 mass % or less, much more preferably 10 mass % or less.

As used herein, the concept "film-forming component" refers to a relevant component contained in the composition, the solvent being excluded.

The cross-linking agent contained in the releasing agent composition, which may cause cross-linking reaction by self-condensation of molecules of the cross-linking agent, reacts (crosslinks) with the polynuclear phenol derivative contained in the composition, to thereby eventually form a cured film.

The releasing agent composition contains at least one of an acid generator and an acid. The acid generator or the acid contributes to promotion of cross-linking reaction and to formation of a suitable cured film at high reproducibility.

Examples of the acid generator include a thermal acid generator and a photoacid generator.

No particular limitation is imposed on the thermal acid generator, so long as it generates an acid by heating. Specific examples of the thermal acid generator include, but are not limited to, 2,4,4,6-tetrabromocyclohexadienone, benzoin tosylate, 2-nitrobenzyl tosylate, K-PURE [registered trademark] CXC-1612, CXC-1614, TAG-2172, TAG-2179, TAG-2678, TAG2689, and TAG2700 (products of King Industries), SI-45, SI-60, SI-80, SI-100, SI-110, and SI-150 (products of SANSHIN CHEMICAL INDUSTRY CO., LTD.), and organic sulfonic acid alkyl esters.

Examples of the photoacid generator include an onium salt compound, a sulfonimide compound, and a disulfonyldiazomethane compound.

Specific examples of the onium salt compound include, but are not limited to, iodonium salt compounds, such as diphenyliodonium hexafluorophosphate, diphenyliodonium trifluoromethanesulfonate, diphenyliodonium nonafluoro-normal-butanesulfonate, diphenyliodonium perfluoro-normal-octanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoro-normal-butanesulfonate, triphenylsulfonium camphorsulfonate, and triphenylsulfonium trifluoromethanesulfonate.

Specific examples of the sulfonimide compound include, but are not limited to, N-(trifluoromethanesulfonyloxy)succinimide, N-(nonafluoro-normal-butanesulfonyloxy)succinimide, N-(camphorsulfonyloxy)succinimide, and N-(trifluoromethanesulfonyloxy)naphthalimide.

Specific examples of the disulfonyldiazomethane compound include, but are not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

Specific examples of the acid include, but are not limited to, arylsulfonic acids and salts thereof (e.g., pyridinium salts), such as p-toluenesulfonic acid, pyridinium p-toluenesulfonate, pyridinium phenolsulfonate, 5-sulfosalicylic acid, 4-phenolsulfonic acid, 4-chlorobenzenesulfonic acid, benzenesulfonic acid, and 1-naphthalenesulfonic acid; arylcarboxylic acids and salts thereof, such as salicylic acid, benzoic acid, hydroxybenzoic acid, and naphthalenecarboxylic acid; chain or cyclic alkylsulfonic acids and salts thereof, such as trifluoromethanesulfonic acid and camphorsulfonic acid; and chain or cyclic alkylcarboxylic acids and salts thereof, such as citric acid.

The amount of the acid generator or acid contained in the releasing agent composition cannot unequivocally be determined, since the amount varies depending on, for example, the type of the cross-linking agent to be used, or the temperature of heating. The amount of the acid generator or the acid is generally 0.01 to 5 mass % relative to the film-forming components. From the viewpoints of achieving suitable curing and producing, at high reproducibility, a laminate from which a support substrate can be effectively debonded, the amount of the acid generator or the acid is preferably 0.1 mass % or more, more preferably 0.5 mass % or more, still more preferably 1.0 mass % or more, and is preferably 30 mass % or less, more preferably 20 mass % or less, still more preferably 10 mass % or less.

The releasing agent composition may contain a solvent for the purpose of, for example, adjustment of viscosity. Such a solvent may be, for example, a highly soluble solvent that can effectively dissolve the polynuclear phenol derivative or a like component. If necessarily, a low-polarity solvent may be used for the purpose of, for example, adjustment of viscosity or surface tension. As used herein, the term "low-polarity solvent" refers to a solvent exhibiting a relative permittivity of less than 7 at a frequency of 100 kHz, and the term "high-polarity solvent" refers to a solvent exhibiting a relative permittivity of 7 or more at a frequency of 100 kHz. A single solvent may be used, or two or more solvents may be used in combination.

Examples of the high-polarity solvent include amide solvents, such as N,N-dimethylformamide, N,N-dimethylacetamide, N,N-dimethylisobutylamide, N-methylpyrrolidone, and 1,3-dimethyl-2-imidazolidinone; ketone solvents, such as ethyl methyl ketone, isophorone, and cyclohexanone; cyano solvents, such as acetonitrile and 3-methoxypropionitrile; polyhydric alcohol solvents, such as ethylene glycol, diethylene glycol, triethylene glycol, dipropylene glycol, 1,3-butanediol, and 2,3-butanediol; monovalent alcohol solvents other than aliphatic alcohols, such as propylene glycol monomethyl ether, diethylene glycol monomethyl ether, diethylene glycol momophenyl ether, triethylene glycol monomethyl ether, dipropylene glycol monomethyl ether, benzyl alcohol, 2-phenoxyethanol, 2-benzyloxyethanol, 3-phenoxybenzyl alcohol, and tetrahydrofurfuryl alcohol; and sulfoxide solvents, such as dimethyl sulfoxide.

Examples of the low-polarity solvent include chlorine-containing solvents, such as chloroform and chlorobenzene; aromatic hydrocarbon solvents, such as alkylbezenes, for example, toluene, xylene, tetraline, cyclohexylbenzene, and decylbenzene; aliphatic alcohol solvents, such as 1-octanol, 1-nonanol, and 1-decanol; ether solvents, such as tetrahydrofuran, dioxane, anisole, 4-methoxytoluene, 3-phenoxytoluene, dibenzyl ether, diethylene glycol dimethyl ether, diethylene glycol butyl methyl ether, triethylene glycol dimethyl ether, and triethylene glycol butyl methyl ether; and ester solvents, such as methyl benzoate, ethyl benzoate, butyl benzoate, isoamyl benzoate, bis(2-ethylhexyl) phthalate, dibutyl maleate, dibutyl oxalate, hexyl acetate, propylene glycol monomethyl ether acetate, diethylene glycol monoethyl ether acetate, and diethylene glycol monobutyl ether acetate.

When the releasing agent composition contains a solvent, the amount of the solvent is appropriately determined in consideration of, for example, a desired viscosity of the composition, the application method to be used, and the thickness of a thin film to be formed. The amount of the solvent is 99 mass % or less relative to the entire composition.

The viscosity and surface tension of the releasing agent composition are appropriately adjusted by varying the type of the organic solvent used, the compositional proportions of the organic solvent, and the film-forming component concentration in consideration of various factors, such as the application method to be used, and a desired film thickness.

In a preferred embodiment, the releasing agent composition contains a solvent. The amount of the solvent is 80 to 99 mass % relative to the entire composition. In such a case, the amount of the film-forming components is 1 to 20 mass % relative to the entire composition.

In a certain embodiment of the present invention, the releasing agent composition contains a glycol solvent, from the viewpoints of, for example, preparing a composition having high homogeneity at high reproducibility, preparing a composition having high storage stability at high reproducibility, and preparing a composition that forms a highly homogeneous thin film at high reproducibility. As used herein, the term "glycol solvent" collectively refers to glycols, glycol monoethers, glycol diethers, glycol monoesters, glycol diesters, and glycol ester ethers.

An example of a preferred glycol solvent is represented by formula (G).

[F17]

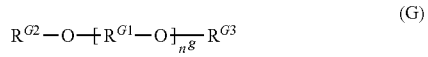

$$R^{G2}-O \!-\!\!\!\left[R^{G1}-O\right]_{\overline{n^g}} R^{G3} \tag{G}$$

In formula (G), $R^{G1}$ independently represents a C2 to C4 linear-chain or branched-chain alkylene group; each of $R^{G2}$ and $R^{G3}$ independently represents a hydrogen atom, a linear-chain or branched-chain C1 to C8 alkyl group, or an alkylacyl group wherein the alkyl moiety is a C1 to C8 linear-chain or branched-chain alkyl group; and $n^g$ represents an integer of 1 to 6.

Specific examples of the C2 to C4 linear-chain or branched-chain alkylene group include, but are not limited to, ethylene, trimethylene, 1-methylethylene, tetramethylene, 2-methylpropane-1,3-diyl, pentamethylene, and hexamethylene.

In particular, a C2 to C3 linear-chain or branched-chain alkylene group is preferred, and a C3 linear-chain or branched-chain alkylene group is more preferred, from the viewpoints of, for example, preparing a composition having high homogeneity at high reproducibility, preparing a composition having high storage stability at high reproducibility, and preparing a composition that forms a highly homogeneous thin film at high reproducibility.

Specific examples of the linear-chain or branched-chain C1 to C8 alkyl group include, but are not limited to, methyl, ethyl, n-propyl, i-propyl, n-butyl, i-butyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Of these, methyl and ethyl are preferred, with methyl being more preferred, from the viewpoints of providing a highly uniform composition at high reproducibility, providing a composition having high storage stability at high reproducibility, providing a composition which can form a highly uniform film at high reproducibility, etc.

In the alkylacyl group in which the alkyl moiety is a C1 to C8 linear-chain or branched-chain alkyl group, specific examples of the C1 to C8 linear-chain or branched-chain alkyl group are the same as those described above.

In particular, a methylcarbonyl group or an ethylcarbonyl group is preferred, and a methylcarbonyl group is more preferred, from the viewpoints of, for example, preparing a composition having high homogeneity at high reproducibility, preparing a composition having high storage stability at high reproducibility, and preparing a composition that forms a highly homogeneous thin film at high reproducibility.

In formula (G), $n^g$ is preferably 4 or less, more preferably 3 or less, still more preferably 2 or less, most preferably 1, from the viewpoints of, for example, preparing a composition having high homogeneity at high reproducibility, preparing a composition having high storage stability at high reproducibility, and preparing a composition that forms a highly homogeneous thin film at high reproducibility.

In formula (G), preferably, at least one of $R^{G2}$ and $R^{G3}$ is a linear-chain or branched-chain C1 to C8 alkyl group, and more preferably, one of $R^{G2}$ and $R^{G3}$ is a linear-chain or branched-chain C1 to C8 alkyl group, and the other is a hydrogen atom or an alkylacyl group wherein the alkyl moiety is a C1 to C8 linear-chain or branched-chain alkyl group, from the viewpoints of, for example, preparing a composition having high homogeneity at high reproducibility, preparing a composition having high storage stability at high reproducibility, and preparing a composition that forms a highly homogeneous thin film at high reproducibility.

The amount of the glycol solvent is preferably 50 mass % or more, more preferably 70 mass % or more, still more preferably 80 mass % or more, yet more preferably 90 mass % or more, much more preferably 95 mass % or more, relative to the entire solvent contained in the releasing agent composition, from the viewpoints of, for example, preparing a composition having high homogeneity at high reproducibility, preparing a composition having high storage stability at high reproducibility, and preparing a composition that forms a highly homogeneous thin film at high reproducibility.

In the releasing agent composition, the film-forming components are homogeneously dispersed or dissolved (preferably, dissolved) in the solvent, from the viewpoints of, for example, preparing a composition having high homogeneity at high reproducibility, preparing a composition having high storage stability at high reproducibility, and preparing a composition that forms a highly homogeneous thin film at high reproducibility.

The releasing agent composition can be produced by mixing of a polynuclear phenol derivative represented by formula (P), a cross-linking agent, an acid generator and/or an acid, and a solvent (if used).

No particular limitation is imposed on the order of mixing of these components. Examples of the method for producing the releasing agent composition with ease and at high reproducibility include, but are not limited to, a method in which a polynuclear phenol derivative represented by formula (P), a cross-linking agent, and an acid generator and/or an acid are dissolved in a solvent at one time; and a method in which a portion of a mixture of a polynuclear phenol derivative represented by formula (P), a cross-linking agent, and an acid generator and/or an acid is dissolved in a solvent, the remaining portion of the mixture is dissolved in another solvent, and the resultant solutions are mixed together. The releasing agent composition may be appropriately heated during preparation thereof, so long as the components of the composition are not decomposed or denatured.

In the present invention, the releasing agent composition may be filtered for the purpose of removing foreign matter by means of, for example, a sub-micrometer filter in the middle of the production process for the composition or after mixing of all the components.

The release layer included in the laminate of the present invention generally has a thickness of 10 nm to 10 μm.

The present invention is also directed to the above-described releasing agent composition, and related conditions (e.g., suitable conditions or production conditions) are as described above. The releasing agent composition of the present invention can produce, at high reproducibility, a film suitably serving as a release layer that can be used for the production of, for example, a semiconductor device.

The adhesive layer included in the laminate of the present invention may be, for example, a film formed from an adhesive composition containing an adhesive component (S).

No particular limitation is imposed on the adhesive component (S), so long as it is used in this type of application. Examples of the adhesive component (S) include, but are not limited to, a silicone adhesive, an acrylic resin adhesive, an epoxy resin adhesive, a polyamide adhesive, a polystyrene adhesive, a polyimide adhesive, and a phenolic resin adhesive.

In particular, the adhesive component (S) is preferably a silicone adhesive, since the silicone adhesive exhibits suitable bonding property during processing of a wafer, etc., can be suitably debonded after the processing, and exhibits excellent heat resistance.

In one preferred embodiment of the present invention, the adhesive composition used in the present invention contains, as an adhesive component, a polyorganosiloxane component (A) which is cured through hydrosilylation. In a more preferred embodiment, the polyorganosiloxane component (A) which is cured through hydrosilylation contains a polysiloxane (A1) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T), and a platinum group metal catalyst (A2); wherein the polysiloxane (A1) contains a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T', and a polyorganosiloxane (a2) having one or more units selected from the group consisting of a siloxane unit represented by $SiO_2$ (unit Q''), a siloxane unit represented by $R^{1''}R^{2''}R^{3''}SiO_{1/2}$ (unit M''), a siloxane unit represented by $R^{4''}R^{5''}SiO_{2/2}$ (unit D''), and a siloxane unit represented by $R^{6''}SiO_{3/2}$ (unit T''), and at least one unit selected from the group consisting of unit M'', unit D'', and unit T''.

Each of $R^1$ to $R^6$ is a group or an atom bonded to a silicon atom and represents an alkyl group, an alkenyl group, or a hydrogen atom.

Each of $R^{1'}$ to $R^{6'}$ is a group bonded to a silicon atom and represents an alkyl group or an alkenyl group, and at least one of $R^{1'}$ to $R^{6'}$ is an alkenyl group.

Each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom.

The alkyl group may be linear-chain, branched-chain, or cyclic. However, a linear-chain or branched-chain alkyl group is preferred. No particular limitation is imposed on the number of carbon atoms thereof, and the number of carbon atoms is generally 40 or less, preferably 30 or less, more preferably 20 or less, still more preferably 10 or less.

Specific examples of the linear-chain or branched-chain alkyl group include, but are not limited to, methyl, ethyl, n-propyl, i-propyl, n-butyl, i-butyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Of these, methyl is preferred.

Specific examples of the cycloalkyl group include, but are not limited to, cycloalkyl groups such as cyclopropyl, cyclobutyl, 1-methyl-cyclopropyl, 2-methyl-cyclopropyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethyl-cyclopropyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-1-propyl-cyclopropyl, 2-i-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl, and 2-ethyl-3-methyl-cyclopropyl; and bicycloalkyl groups such as bicyclobutyl, bicyclopentyl, bicyclohexyl, bicycloheptyl, bicyclooctyl, bicyclononyl, and bicyclodecyl.

The alkenyl group may be linear-chain or branched-chain. No particular limitation is imposed on the number of carbon atoms thereof, and the number of carbon atoms is generally 2 to 40, preferably 30 or less, more preferably 20 or less, still more preferably 10 or less.

Specific examples of the alkenyl group include, but are not limited to, ethenyl, 1-propenyl, 2-propenyl, 1-methyl-1-ethenyl, 1-butenyl, 2-butenyl, 3-butenyl, 2-methyl-1-propenyl, 2-methyl-2-propenyl, 1-ethylethenyl, 1-methyl-1-propenyl, 1-methyl-2-propenyl, 1-pentenyl, 2-pentenyl, 3-pentenyl, 4-pentenyl, 1-n-propylethenyl, 1-methyl-1-butenyl, 1-methyl-2-butenyl, 1-methyl-3-butenyl, 2-ethyl-2-propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propylethenyl, 1,2-dimethyl-1-propenyl, 1,2-dimethyl-2-propenyl, 1-cyclopentenyl, 2-cyclopentenyl, 3-cyclopentenyl, 1-hexenyl, 2-hexenyl, 3-hexenyl, 4-hexenyl, 5-hexenyl, 1-methyl-1-pentenyl, 1-methyl-2-pentenyl, 1-methyl-3-pentenyl, 1-methyl-4-pentenyl, 1-n-butylethenyl, 2-methyl-1-pentenyl, 2-methyl-2-pentenyl, 2-methyl-3-pentenyl, 2-methyl-4-pentenyl, 2-n-propyl-2-propenyl, 3-methyl-1-pentenyl, 3-methyl-2-pentenyl, 3-methyl-3-pentenyl, 3-methyl-4-pentenyl, 3-ethyl-3-butenyl, 4-methyl-1-pentenyl, 4-methyl-2-pentenyl, 4-methyl-3-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1-methyl-2-ethyl-2-propenyl, 1-s-butylethenyl, 1,3-dimethyl-1-butenyl, 1,3-dimethyl-2-butenyl, 1,3-dimethyl-3-butenyl, 1-i-butylethenyl, 2,2-dimethyl-3-butenyl, 2,3-dimethyl-1-butenyl, 2,3-dimethyl-2-butenyl, 2,3-dimethyl-3-butenyl, 2-i-propyl-2-propenyl, 3,3-dimethyl-1-butenyl, 1-ethyl-1-butenyl, 1-ethyl-2-butenyl, 1-ethyl-3-butenyl, 1-n-propyl-1-propenyl, 1-n-propyl-2-propenyl, 2-ethyl-1-butenyl, 2-ethyl-2-butenyl, 2-ethyl-3-butenyl, 1,1,2-trimethyl-2-propenyl, 1-t-butylethenyl, 1-methyl-1-ethyl-2-propenyl, 1-ethyl-2-methyl-1-propenyl, 1-ethyl-2-methyl-2-propenyl, 1-i-propyl-1-propenyl, 1-i-propyl-2-propenyl, 1-methyl-2-cyclopentenyl, 1-methyl-3-cyclopentenyl, 2-methyl-1-cyclopentenyl, 2-methyl-2-cyclopentenyl, 2-methyl-3-cyclopentenyl, 2-methyl-4-cyclopentenyl, 2-methyl-5-cyclopentenyl, 2-methylene-cyclopentyl, 3-methyl-1-cyclopentenyl, 3-methyl-2-cyclopentenyl, 3-methyl-3-cyclopentenyl, 3-methyl-4-cyclopentenyl, 3-methyl-5-cyclopentenyl, 3-methylene-cyclopentyl, 1-cyclohexenyl, 2-cyclohexenyl, and 3-cyclohexenyl.

Of these, ethenyl and 2-propenyl are preferred.

As described above, the polysiloxane (A1) includes the polyorganosiloxane (a1) and the polyorganosiloxane (a2). In curing, the alkenyl group present in the polyorganosiloxane (a1) and the hydrogen atom (Si—H group) present in the polyorganosiloxane (a2) form a cross-linking structure through hydrosilylation in the presence of the platinum group metal catalyst (A2).

The polyorganosiloxane (a1) has one or more units selected from the group consisting of unit Q', unit M', unit D', and unit T', and at least one unit selected from the group consisting of unit M', unit D', and unit T'. Two or more polyorganosiloxanes satisfying the above conditions may be used in combination as the polyorganosiloxane (a1).

Examples of preferred combinations of two or more units selected from the group consisting of unit Q', unit M', unit D', and unit T' include, but are not limited to, (unit Q' and unit M'), (unit D' and unit M'), (unit T' and unit M'), and (unit Q', unit T', and unit M').

In the case where the polyorganosiloxane (a1) includes two or more polyorganosiloxanes, examples of preferred combinations include, but are not limited to, (unit Q' and unit M')+(unit D' and unit M'); (unit T' and unit M')+(unit D' and unit M'); and (unit Q', unit T', and unit M')+(unit T' and unit M').

The polyorganosiloxane (a2) has one or more units selected from the group consisting of unit Q'', unit M'', unit D'', and unit T'', and at least one unit selected from the group consisting of unit M'', unit D'', and unit T''. Two or more polyorganosiloxanes satisfying the above conditions may be used in combination as the polyorganosiloxane (a2).

Examples of preferred combinations of two or more units selected from the group consisting of unit Q'', unit M'', unit D'', and unit T'' include, but are not limited to, (unit M'' and unit D''), (unit Q'' and unit M''), and (unit Q'', unit T'', and unit M'').

The polyorganosiloxane (a1) is formed of siloxane units in which an alkyl group and/or an alkenyl group is bonded to a silicon atom. The alkenyl group content of the entire substituents $R^{1'}$ to $R^{6'}$ is preferably 0.1 mol % to 50.0 mol %, more preferably 0.5 mol % to 30.0 mol %, and the remaining $R^{1'}$ to $R^{6'}$ may be alkyl groups.

The polyorganosiloxane (a2) is formed of siloxane units in which an alkyl group and/or a hydrogen atom is bonded to a silicon atom. The hydrogen atom content of the entire substituents or atoms $R^{1''}$ to $R^{6''}$ is preferably 0.1 mol % to 50.0 mol %, more preferably 10.0 mol % to 40.0 mol %, and the remaining $R^{1''}$ to $R^{6''}$ may be alkyl groups.

The polysiloxane (A1) includes the polyorganosiloxane (a1) and the polyorganosiloxane (a2). In one preferred embodiment of the present invention, the ratio by mole of alkenyl groups present in the polyorganosiloxane (a1) to hydrogen atoms forming Si—H bonds present in the polyorganosiloxane (a2) is 1.0:0.5 to 1.0:0.66.

The weight average molecular weight of each of the polyorganosiloxane (a1) and the polyorganosiloxane (a2) is generally 500 to 1,000,000. From the viewpoint of attaining the effects of the present invention at high reproducibility, the weight average molecular weight is preferably 5,000 to 50,000.

Meanwhile, in the present invention, the weight average molecular weight, number average molecular weight, and polydispersity may be determined by means of, for example, a GPC apparatus (EcoSEC, HLC-8320GPC, products of Tosoh Corporation) and GPC columns (TSKgel SuperMultiporeHZ-N and TSKgel SuperMultiporeHZ-H, products of Tosoh Corporation) at a column temperature of 40° C. and a flow rate of 0.35 mL/min by use of tetrahydrofuran as an eluent (extraction solvent) and polystyrene (product of Sigma-Aldrich) as a standard substance.

The viscosity of each of the polyorganosiloxane (a1) and the polyorganosiloxane (a2) is generally 10 to 1,000,000 (mP·s). From the viewpoint of attaining the effects of the present invention at high reproducibility, the viscosity is preferably 50 to 10,000 (mP·s). Notably, in the present invention, the viscosity of is measured at 25° C. by means of an E-type rotational viscometer.

The polyorganosiloxane (a1) and the polyorganosiloxane (a2) react with each other via hydrosilylation, to thereby form a film. Thus, the curing mechanism differs from the mechanism of curing mediated by, for example, silanol groups. Therefore, neither of the siloxanes is required to have a silanol group or a functional group forming a silanol group through hydrolysis (e.g., an alkyloxy group).

In one preferred embodiment of the present invention, the adhesive component (S) contains the aforementioned polysiloxane (A1) and the platinum group metal catalyst (A2).

The platinum-based metallic catalyst is used to accelerate hydrosilylation between alkenyl groups of the polyorganosiloxane (a1) and Si—H groups of the polyorganosiloxane (a2).

Specific examples of the platinum-based metallic catalyst include, but are not limited to, platinum catalysts such as platinum black, platinum(II) chloride, chloroplatinic acid, a reaction product of chloroplatinic acid and a monohydric alcohol, a chloroplatinic acid-olefin complex, and platinum bis(acetoacetate).

Examples of the platinum-olefin complex include, but are not limited to, a complex of platinum with divinyltetramethyldisiloxane.

The amount of platinum group metal catalyst (A2) is generally 1.0 to 50.0 ppm, with respect to the total amount of polyorganosiloxane (a1) and polyorganosiloxane (a2).

In order to suppress progress of hydrosilylation, the polyorganosiloxane component (A) may contain a polymerization inhibitor (A3).

No particular limitation is imposed on the polymerization inhibitor, so long as it can suppress the progress of hydrosilylation. Specific examples of the polymerization inhibitor include alkynyl alcohols such as 1-ethynyl-1-cyclohexanol and 1,1-diphenyl-2-propyn-1-ol.

Generally, the amount of polymerization inhibitor with respect to the total amount of the polyorganosiloxane (a1) and the polyorganosiloxane (a2) is 1,000.0 ppm or more from the viewpoint of attaining the effect, and 10,000.0 ppm or less from the viewpoint of preventing excessive suppression of hydrosilylation.

The adhesive composition used in the present invention may contain a releasing agent component (B). Through incorporation of the releasing agent component (B) into the adhesive composition used in the present invention, the adhesive layer formed therefrom can be suitably peeled at high reproducibility.

A typical example of the releasing agent component (B) is a polyorganosiloxane. Specific examples of the polyorganosiloxane include, but are not limited to, an epoxy-modified polyorganosiloxane, a methyl-group-containing polyorganosiloxane, and a phenyl-group-containing polyorganosiloxane.

No particular limitation is imposed on the complex viscosity of the polyorganosiloxane serving as the releasing agent component (B). From the viewpoint of producing an adhesive layer having favorable peelability and adhesion at high reproducibility, the complex viscosity is generally 100 to 10,000 (Pa·s). In the present invention, the complex viscosity of the polyorganosiloxane serving as the releasing agent component (B) corresponds to a value as measured at 25° C. by means of a rheometer. The complex viscosity may be measured by means of, for example, Rheometer MCR-302 (product of Anton Paar).

Examples of preferred polyorganosiloxanes (i.e., release agent component (B)) include, but are not limited to, an epoxy-group-containing polyorganosiloxane, a methyl-group-containing polyorganosiloxane, and a phenyl-group-containing polyorganosiloxane.

The polyorganosiloxane serving as the releasing agent component (B) generally has a weight average molecular weight of 100,000 to 2,000,000. The weight average molecular weight is preferably 200,000 to 1,200,000, more preferably 300,000 to 900,000, from the viewpoint of attaining the effects of the present invention at high reproducibility. The polyorganosiloxane generally has a polydispersity of 1.0 to 10.0. The polydispersity is preferably 1.5 to 5.0, more preferably 2.0 to 3.0, from the viewpoint of attaining the effects of the present invention at high reproducibility. The weight average molecular weight and the polydispersity may be measured through the methods as described above.

The epoxy-group-containing polyorganosiloxane includes such a siloxane containing a siloxane unit represented by, for example, $R^{11}R^{12}SiO_{2/2}$(unit $D^{10}$)

$R^{11}$ is a group bonded to a silicon atom and represents an alkyl group, and $R^{12}$ is a group bonded to a silicon atom and represents an epoxy group or an organic group containing an epoxy group. Specific examples of the alkyl group include those as exemplified above.

The epoxy group in the organic group containing an epoxy group may be an independent epoxy group which does not condense with another ring structure, or may be an epoxy group forming a condensed ring with another ring structure (e.g., a 1,2-epoxycyclohexyl group).

Specific examples of the organic group containing an epoxy group include, but are not limited to, 3-glycidoxypropyl and 2-(3,4-epoxycyclohexyl)ethyl.

In the present invention, examples of preferred epoxy-group-containing polyorganosiloxanes include, but are not limited to, epoxy-modified polydimethylsiloxane.

The epoxy-group-containing polyorganosiloxane contains the aforementioned siloxane unit (unit $D^{10}$), but may also contain the aforementioned unit Q, unit M and/or unit T, in addition to unit $D^{10}$.

In one preferred embodiment of the present invention, specific examples of the epoxy-group-containing polyorganosiloxane include polyorganosiloxane formed only of unit $D^{10}$, polyorganosiloxane formed of unit $D^{10}$ and unit Q, polyorganosiloxane formed of unit $D^{10}$ and unit M, polyorganosiloxane formed of unit $D^{10}$ and unit T, polyorganosiloxane formed of unit $D^{10}$, unit Q, and unit M, polyorganosiloxane formed of unit $D^{10}$, unit M, and unit T, and polyorganosiloxane formed of unit $D^{10}$, unit Q, unit M, and unit T.

The epoxy-group-containing polyorganosiloxane is preferably an epoxy-group-containing polydimethylsiloxane having an epoxy value of 0.1 to 5. The weight average molecular weight thereof is generally 1,500 to 500,000, but preferably 100,000 or lower, for the purpose of suppression of precipitation in the adhesive.

Specific examples of the epoxy-group-containing polyorganosiloxane include, but are not limited to, those represented by formulas (E1) to (E3):

[F18]

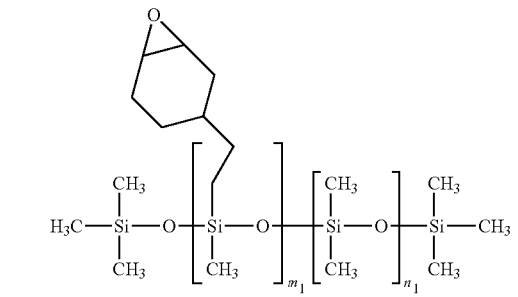

(E1)

(wherein each of $m_1$ and $n_1$ represents the number of repeating units and is a positive integer);

[F19]

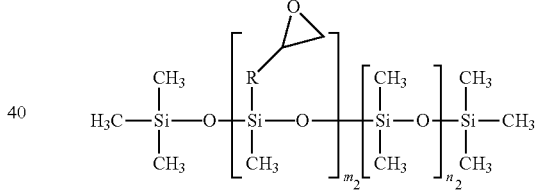

(E2)

(wherein each of $m_2$ and $n_2$ represents the number of repeating units and is a positive integer, and R represents a C1 to C10 alkylene group); and

[F20]

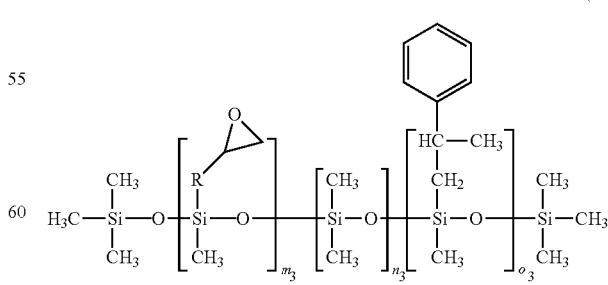

(E3)

(wherein each of $m_3$, $n_3$ and $O_3$ represents the number of repeating units and is a positive integer, and R represents a C1 to C10 alkylene group).

The methyl-group-containing polyorganosiloxane includes, for example, a siloxane containing a siloxane unit represented by $R^{210}R^{220}SiO_{2/2}$ (unit $D^{200}$), preferably a siloxane containing a siloxane unit represented by $R^{21}R^{21}SiO_{2/2}$ (unit $D^{20}$).

Each of $R^{210}$ and $R^{220}$ is a group bonded to a silicon atom and represents an alkyl group. At least one of $R^{210}$ and $R^{220}$ is a methyl group. Specific examples of the alkyl group include those as exemplified above.

$R^{21}$ is a group bonded to a silicon atom and represents an alkyl group. Specific examples of the alkyl group include those as exemplified above. $R^{21}$ is preferably a methyl group.

In the present invention, examples of preferred methyl-group-containing polyorganosiloxanes include, but are not limited to, polydimethylsiloxane.

The methyl-group-containing polyorganosiloxane contains the aforementioned siloxane unit (unit $D^{200}$ or unit $D^{20}$), but may also contain the aforementioned unit Q, unit M and/or unit T, in addition to unit $D^{200}$ or unit $D^{20}$.

In one embodiment of the present invention, specific examples of the methyl-group-containing polyorganosiloxane include polyorganosiloxane formed only of unit $D^{200}$, polyorganosiloxane formed of unit $D^{200}$ and unit Q, polyorganosiloxane formed of unit $D^{200}$ and unit M, polyorganosiloxane formed of unit $D^{200}$ and unit T, polyorganosiloxane formed of unit $D^{200}$, unit Q, and unit M, polyorganosiloxane formed of unit $D^{200}$, unit M, and unit T, and polyorganosiloxane formed of unit $D^{200}$, unit Q, unit M, and unit T.

In one preferred embodiment of the present invention, specific examples of the methyl-group-containing polyorganosiloxane include polyorganosiloxane formed only of unit $D^{20}$, polyorganosiloxane formed of unit $D^{20}$ and unit Q, polyorganosiloxane formed of unit $D^{20}$ and unit M, polyorganosiloxane formed of unit $D^{20}$ and unit T, polyorganosiloxane formed of unit $D^{20}$, unit Q, and unit M, polyorganosiloxane formed of unit $D^{20}$, unit M, and unit T, and polyorganosiloxane formed of unit $D^{20}$, unit Q, unit M, and unit T.

Specific examples of the methyl-group-containing polyorganosiloxane include, but are not limited to, a polyorganosiloxane represented by formula (M1):

[F21]

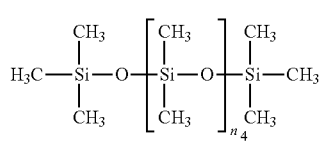

(M1)

(wherein $n_4$ represents the number of repeating units and is a positive integer).

Examples of the phenyl-group-containing polyorganosiloxane include a siloxane containing a siloxane unit represented by $R^{31}R^{32}SiO_{2/2}$ (unit $D^{30}$)

$R^{31}$ is a group bonded to a silicon atom and represents a phenyl group or an alkyl group, and $R^{32}$ is a group bonded to a silicon atom and represents a phenyl group. Specific examples of the alkyl group include those as exemplified above. $R^{31}$ is preferably a methyl group.

The phenyl-group-containing polyorganosiloxane contains the aforementioned siloxane unit (unit $D^{30}$), but may also contain the aforementioned unit Q, unit M and/or unit T, in addition to unit $D^{30}$.

In one preferred embodiment of the present invention, specific examples of the phenyl-group-containing polyorganosiloxane include polyorganosiloxane formed only of unit $D^{30}$, polyorganosiloxane formed of unit $D^{30}$ and unit Q, polyorganosiloxane formed of unit $D^{30}$ and unit M, polyorganosiloxane formed of unit $D^{30}$ and unit T, polyorganosiloxane formed of unit $D^{30}$, unit Q, and unit M, polyorganosiloxane formed of unit $D^{30}$, unit M, and unit T, and polyorganosiloxane formed of unit $D^{30}$, unit Q, unit M, and unit T.

Specific examples of the methyl-group-containing polyorganosiloxane include, but are not limited to, a polyorganosiloxane represented by formula (P1) or (P2):

[F22]

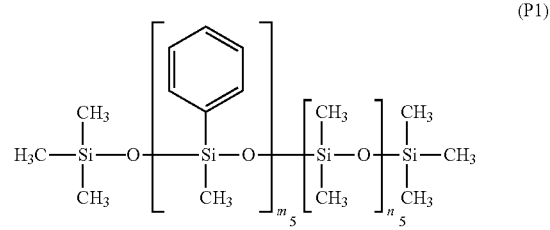

(P1)

(wherein each of $m_5$ and $n_5$ represents the number of repeating units and is a positive integer); or

[F23]

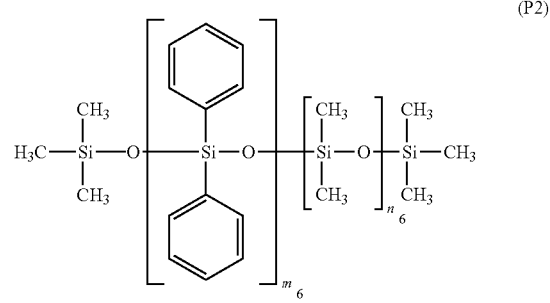

(P2)

(wherein each of $m_6$ and $n_6$ represents the number of repeating units and is a positive integer).

In one preferred embodiment, the adhesive composition used in the present invention contains the polyorganosiloxane component (A) which is cured through hydrosilylation and the releasing agent component (B). In a preferred embodiment, the adhesive composition contains a polyorganosiloxane as the releasing agent component (B).

The adhesive composition used in the present invention may contain the adhesive component (S) and the releasing agent component (B) at any ratio. In consideration of balance between adhesiveness and peelability, the ratio by mass of component (S) to component (B) is preferably 99.995:0.005 to 30:70, more preferably 99.9:0.1 to 75:25.

In other words, when the adhesive composition contains the polyorganosiloxane component (A) which is cured through hydrosilylation, the ratio by mass of component (A) to component (B) is preferably 99.995:0.005 to 30:70, more preferably 99.9:0.1 to 75:25.

For the purpose of adjusting the viscosity or for other reasons, the adhesive composition used in the present invention may contain a solvent. Specific examples of the solvent include, but are not limited to, an aliphatic hydrocarbon, an aromatic hydrocarbon, and a ketone.

More specific examples of the solvent include, but are not limited to, hexane, heptane, octane, nonane, decane, undecane, dodecane, isododecane, menthane, limonene, toluene, xylene, mesitylene, cumene, MIBK (methyl isobutyl ketone), butyl acetate, diisobutyl ketone, 2-octanone, 2-nonanone, and 5-nonanone. These solvents may be used singly or in combination of two or more species.

In the case where the adhesive composition used in the present invention contains a solvent, the solvent content is appropriately adjusted in consideration of a target viscosity thereof, the application method to be employed, the thickness of the formed thin film, etc. The solvent content of the entire adhesive composition is generally about 10 to about 90 mass %.

The viscosity (25° C.) of the adhesive composition used in the present invention is generally 500 to 20,000 mPa·s, preferably 1,000 to 5,000 mPa·s. In consideration of various factors such as the application method to be employed and the thickness of the formed thin film, the viscosity of the adhesive composition of the present invention may be adjusted by modifying the type and composition of the organic solvent employed, the film-forming component concentration, etc.

The adhesive composition used in the present invention may be produced by mixing the adhesive component (S) and a solvent with the releasing agent component (B) which is optionally used.

No particular limitation is imposed on the sequential order of mixing, so long as the adhesive composition can be easily produced at high reproducibility. One possible example of the production method includes dissolving the adhesive component (S) and the releasing agent component (B) in a solvent. Another possible example of the production method includes dissolving a part of the adhesive component (S) and the releasing agent component (B) in a solvent, dissolving the remaining components in another solvent, and mixing the two thus-obtained solutions. However, the production method is not limited to the above examples. Notably, so long as the relevant components are not decomposed or denatured in preparation of the adhesive composition, the mixture may be appropriately heated.

In the present invention, in order to remove foreign substances present in the adhesive composition, the composition may be filtered through a sub-micrometer filter or the like in the course of production of the composition or after mixing all the components.

The adhesive layer included in the laminate of the present invention generally has a thickness of 5 to 500 μm. From the viewpoint of securing film strength, the thickness is preferably 10 μm or more, more preferably 20 μm or more, still more preferably 30 μm or more. From the viewpoint of avoiding inhomogeneity due to a large film thickness, the thickness is preferably 200 μm or less, more preferably 150 μm or less, still more preferably 120 μm or less, much more preferably 70 μm or less.

The laminate of the present invention can be produced by, for example, a method including a first step of applying the adhesive composition to a surface of a first substrate, and heating the composition to thereby form an adhesive coating layer; a second step of applying the releasing agent composition to a surface of a second substrate, and heating the composition to thereby form a releasing agent coating layer; and a third step of bringing the adhesive coating layer of the first substrate into close contact with the releasing agent coating layer of the second substrate under application of a load in a thickness direction of the first and second substrates while performing at least one of heat treatment and reduced pressure treatment, followed by post-heat treatment, to thereby produce a laminate.

The adhesive composition and the releasing agent composition may be applied to and heated on the first substrate and the second substrate, respectively. Alternatively, the adhesive composition and the releasing agent composition may be sequentially applied to and heated on either of the substrates, so long as the effects of the present invention are not impaired. In such a case, these compositions may be applied in any order. In a preferred embodiment of the present invention, the adhesive composition is applied to a surface of the first substrate to thereby form an adhesive coating layer, and the releasing agent composition is applied to a surface of the second substrate to thereby form a releasing agent coating layer, from the viewpoint of producing, at high reproducibility, a laminate from which the second substrate can be effectively debonded.

More specifically, the adhesive composition or the releasing agent composition is applied to and heated on a circuit surface of the first substrate (i.e., wafer) or a surface of the second substrate (i.e., support), to thereby form an adhesive coating layer or a releasing agent coating layer. Subsequently, the circuit surface of the wafer is placed on the surface of the support so that the two coating layers come into contact with each other, and these two layers are closely adhered under application of a load in a thickness direction of the first and second substrates while performing heat treatment or reduced pressure treatment or both of these treatments, followed by post-heat treatment, to thereby produce a laminate.

No particular limitation is imposed on the application method, and spin coating is generally performed. In an alternative method, a coating film is formed through spin coating or a similar technique, and the sheet-form coating film is attached. The concepts of the application method and the coating film of the invention also encompass the alternative method and coating film.

The temperature of heating the applied adhesive composition cannot unequivocally be determined, since the temperature varies depending on, for example, the type or amount of the adhesive component contained in the adhesive composition, the presence or absence of a solvent in the composition, or a desired thickness of the adhesive layer. The heating temperature is generally 80° C. to 150° C., and the heating time is generally 30 seconds to 5 minutes.

The temperature of heating the applied releasing agent composition cannot unequivocally be determined, since the temperature varies depending on, for example, the type or amount of the cross-linking agent, the acid generator, the acid, etc., the presence or absence of a solvent in the composition, or a desired thickness of the release layer. The temperature is 120° C. or higher from the viewpoint of achieving suitable curing at high reproducibility, and the temperature is 400° C. or lower from the viewpoint of preventing excessive curing. The heating time is generally 1 minute to 10 minutes.

The heating may be performed by means of a hot plate, an oven, or the like.

The adhesive coating layer formed through application and heating of the adhesive composition generally has a thickness of about 5 to about 500 μm. The thickness is appropriately determined so that the thickness of the adhesive layer finally falls within the aforementioned range.

The releasing agent coating layer formed through application and heating of the releasing agent composition generally has a thickness of about 10 nm to about 10 μm. The thickness is appropriately determined so that the thickness of the release layer finally falls within the aforementioned range.

The laminate of the present invention can be produced by bringing these coating layers into contact with each other, and closely adhering these two layers under application of a load in a thickness direction of the first and second substrates while performing heat treatment or reduced pressure treatment or both of these treatments, followed by post-heat treatment. The choice of the heat treatment, the reduced pressure treatment, or both of these treatments in combination is determined in consideration of various factors, including the type of the adhesive composition, the specific components of the releasing agent composition, the compatibility between films formed from these compositions, the film thickness, and the bonding strength required.

The heat treatment is generally performed at a temperature appropriately selected from a range of 20 to 150° C., from the viewpoints of, for example, softening the adhesive coating layer and achieving suitable bonding between the adhesive coating layer and the releasing agent coating layer, and achieving suitable curing of the releasing agent coating layer. In particular, the heat treatment is preferably performed at 130° C. or lower, more preferably at 90° C. or lower, from the viewpoint of preventing and avoiding excessive curing or unnecessary denaturation of the adhesive component (S). The heating time is generally 30 seconds or more, preferably 1 minute or more, from the viewpoint of securing the adhesive performance, and is generally 10 minutes or less, preferably 5 minutes or less, from the viewpoint of preventing denaturation of the adhesive layer or another member.

In the reduced pressure treatment, the adhesive coating layer and the releasing agent coating layer, being in contact with each other, are placed in an atmosphere at 10 Pa to 10,000 Pa. The time of the reduced pressure treatment is generally 1 to 30 minutes.

From the viewpoint of producing, at high reproducibility, a laminate whose support substrate can be suitably removed, the adhesive coating layer and the releasing agent coating layer, being in contact with each other, are bonded together through preferably reduced-pressure treatment, more preferably heating treatment in combination of reduced-pressure treatment.

No particular limitation is imposed on the load which is applied to the first and second substrates in a thickness direction, so long as the first and second substrates, and the two layers disposed therebetween are not damaged, and these elements are closely adhered. The load is generally 10 to 1,000 N.

The temperature of post-heating is preferably 120° C. or higher from the viewpoint attaining sufficient curing rate, and preferably 260° C. or lower from the viewpoint of preventing deterioration of the substrates and the adhesive. The heating time is generally 1 minute or longer from the viewpoint of suitable joining of the substrates and layers forming the laminate, preferably 5 minutes or longer. Also, the heating time is generally 180 minutes or shorter, preferably 120 minutes or shorter, from the viewpoint of avoiding, for example, an adverse effect on the adhesive layer and the release layer due to excessive heating. Heating may be performed by means of a hot plate, an oven, or the like.

Notably, one purpose of performing post-heating is to attain more suitable curing of the adhesive component (S).

In the debonding method carried out in the present invention, the release layer of the laminate of the present invention is irradiated with light from the second substrate side, to thereby separate the second substrate from the first substrate and the adhesive layer. In the laminate of the present invention, the first substrate and the second substrate which allows passage of light are suitably temporarily bonded in a peelable manner by the mediation of the adhesive layer and the release layer which absorbs light. Thus, when the laminate is irradiated with light (e.g., laser light) from the second substrate side, the release layer that has received laser light exerts the aforementioned debonding property. As a result, the second substrate can be readily separated from the first substrate and the adhesive layer. Generally, debonding is performed after production of the laminate of the present invention and a certain subsequent processing and the like.

In the present invention, the processing is, for example, processing of a back surface of a wafer, the surface being opposite the circuit-furnished surface of the wafer, and typical examples include thinning a wafer by polishing (grinding) the backside thereof. Thereafter, the thinned wafer is provided with through silicon vias (TSVs) and the like and then removed from the support. A plurality of such wafers are stacked to form a wafer laminate, to thereby complete 3-dimensional mounting. Before or after the above process, a backside electrode and the like are formed on the wafer. When thinning of a wafer and the TSV process are performed, a thermal load of 250 to 350° C. is applied to the laminate bonded to the support. The laminate of the present invention including the adhesive layer has heat resistance to the load.

In one mode of thinning, the backside surface (a surface opposite the circuit-furnished surface) of a wafer having a diameter of about 300 mm and a thickness of about 770 μm is polished (ground), whereby the thickness of the wafer can be reduced to about 10 μm to about 100 μm.

Notably, the entire area of the adhesive layer is not necessarily irradiated with laser light. Even when the adhesive layer has both a laser light-irradiated area and a laser light-non-irradiated area, it is sufficient that the bonding strength of the entire adhesive layer is satisfactorily reduced. Under such conditions, the second substrate can be easily separated from the laminate by, for example, pulling the second substrate through application of small external force thereto. The ratio of the laser light-irradiated area to the laser light-non-irradiated area and the locational distribution of the two areas vary depending on the type and specific composition of the adhesive composition employed, the thickness of the adhesive layer, the intensity of irradiation laser light, and other factors. However, those skilled in the art can set appropriate conditions, without carrying out excessive tests. For example, a laser light-non-irradiated area may be provided adjacent to a laser light-irradiated area with the same width as that of the laser light with which the adhesive layer is irradiated.

Thus, even when only a part of the adhesive layer is irradiated with laser light, the second substrate can be separated. As a result, the time for applying laser light to one laminate can be shortened, whereby the total time required for debonding can be shortened.

The processed (e.g., thinned) semiconductor substrate production method of the present invention includes a first step of producing the laminate of the present invention; a second step of processing the semiconductor substrate (i.e., first substrate) of the laminate; a third step of debonding the support substrate (i.e., second substrate) from the processed semiconductor substrate (i.e., first substrate) and the adhesive layer; and a fourth step of removing the adhesive layer from the processed semiconductor substrate (i.e., first substrate) and washing the processed semiconductor substrate (i.e., first substrate).

Conditions (e.g., suitable conditions) related to the method for producing the laminate of the present invention in the first step, the method for processing the semiconductor substrate in the second step, and the method for debonding the support substrate from the processed semiconductor substrate and the adhesive layer in the third step are the same as those described above.

The fourth step of removing the adhesive layer from the processed semiconductor substrate (i.e., first substrate) and washing the processed semiconductor substrate (i.e., first substrate) involves removal of the adhesive layer from the processed (e.g., thinned) semiconductor substrate. In this case, when the release layer remains on the adhesive layer, the release layer is also removed. The removal may be performed by use of, for example, a detergent composition containing a salt.

The processed semiconductor substrate production method of the present invention, which includes the aforementioned first to fourth steps, may include a step other than these steps. The aforementioned components and methodological factors in relation to the first to fourth steps may be appropriately modified, without departing from the gist of the present invention.

EXAMPLES

The present invention will next be described in more detail by way of examples, which should not be construed as limiting the invention thereto. The following apparatuses were used.
(1) Agitator A: AWATORI RENTARO (product of Thinky Corporation)
(2) Agitator B: Mix Rotor VMR-5R (product of AS ONE CORPORATION)
(3) Bonding apparatus: Manual Bonder (product of Suss MicroTec)
(4) Laser irradiation apparatus (debonding apparatus): LT-2137 (product of Lotus-TII)

[1] Preparation of Adhesive Composition

Preparation Example 1

A solution of vinyl-group-containing MQ resin (product of WACKER Chemie AG) in p-menthane (concentration: 80.6 mass %) (104.14 g) serving as polyorganosiloxane (a1), a polyorganosiloxane represented by formula (A) (complex viscosity: 800 Pa·s (58.11 g) serving as component (H), and p-menthane (product of Nippon Terpene Chemicals, Inc.) (34.94 g) and n-decane (product of SANKYO CHEMICAL Co., Ltd.) (6.20 g) serving as solvents were added to a 600-mL container dedicated for agitator A, and the mixture was agitated by means of agitator A for 5 minutes.

To the resultant mixture were added SiH-group-containing linear-chain polydimethylsiloxane having a viscosity of 100 mPa·s (product of WACKER Chemie AG) (16.79 g) serving as polyorganosiloxane (a2) and vinyl-group-containing linear-chain polydimethylsiloxane having a viscosity of 200 mPa·s (product of WACKER Chemie AG) (24.54 g) serving as polyorganosiloxane (a1). To the resultant mixture was added a portion (1.29 g) of a mixture prepared by agitation of 1,1-diphenyl-2-propyn-1-ol (product of Tokyo Chemical Industry Co., Ltd.) (1.61 g) and 1-ethynyl-1-cyclohexanol (product of WACKER Chemie AG) (1.61 g) serving as polymerization inhibitor (A3) and p-menthane (product of Nippon Terpene Chemicals, Inc.) (3.23 g) serving as a solvent by means of agitator B for 60 minutes. The resultant mixture was agitated by means of agitator A for 5 minutes.

To the resultant mixture was added a portion (4.00 g) of a mixture prepared by agitation of a platinum catalyst (product of WACKER Chemie AG) (0.65 g) serving as catalyst (A2) and vinyl-group-containing linear-chain polydimethylsiloxane having a viscosity of 1,000 mPa·s (product of WACKER Chemie AG) (19.37 g) serving as polyorganosiloxane (a1) by means of agitator A for 5 minutes. The resultant mixture was agitated by means of agitator A for 5 minutes.

Finally, the resultant mixture was filtered through a nylon filter (300 mesh), to thereby prepare an adhesive composition. The adhesive composition was found to have a viscosity of 3,000 mPa·s.

[F24]

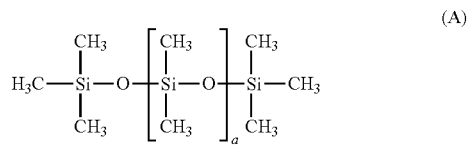

(A)

(In formula (A), a represents the number of repeating units and is a positive integer.)

[2] Preparation of Releasing Agent Composition

Example 1-1

A compound represented by formula ($L^{17}M$) (trade name: TMOM-BP, product of Honshu Chemical Industry Co., Ltd.) (0.22 g) serving as a cross-linking agent and 1 mass % solution of pyridinium p-toluenesulfonate in propylene glycol monomethyl ether (2.23 g) serving as an acid were added to a polynuclear phenol derivative represented by formula (P1) (trade name: TEP-TPA, product of ASAHI YUKIZAI CORPORATION) (1.11 g), and the resultant mixture was agitated. Propylene glycol monomethyl ether (10.84 g) and propylene glycol monomethyl ether acetate (5.59 g) were added to the mixture, and the resultant mixture was agitated.

The mixture was filtered through a polyethylene-made microfilter (pore size: 0.2 m), to thereby prepare a releasing agent composition.

[F25]

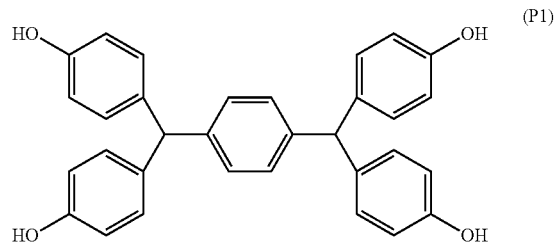

(P1)

-continued

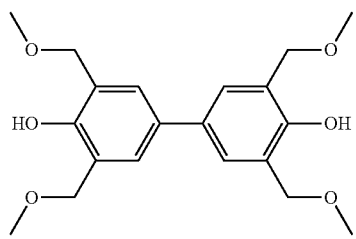

(L17M)

[3] Production of Laminate

Example 2-1

The releasing agent composition prepared in Example 1-1 was applied through spin coating to a 100-mm glass wafer so that the thickness of a release layer in the final product (i.e., laminate) was adjusted to about 200 nm, and the applied composition was heated at 250° C. for 5 minutes, to thereby form a releasing agent coating layer on the glass wafer (i.e., second substrate).

The adhesive composition prepared in Preparation Example 1 was applied by spin coating to a 100-mm silicon wafer so that the thickness of an adhesive layer in the final product (i.e., laminate) was about 60 μm, and the applied composition was heated at 120° C. for 1.5 minutes, to thereby form an adhesive coating layer on the silicon wafer (i.e., first substrate).

The glass wafer and the silicon wafer are bonded together by means of the bonding apparatus so as to sandwich the releasing agent coating layer and the adhesive coating layer between these wafers, and post-heat treatment was performed at 200° C. for 10 minutes, to thereby produce a laminate. The bonding was performed at a temperature of 23° C. and a reduced pressure of 1,500 Pa.

[4] Determination of Optimal Irradiation Dose of Laser Light (355 nm)

The resultant laminate was irradiated with laser light from the glass wafer side by means of the laser irradiation apparatus. The minimum laser output required for occurrence of debonding was determined within an output range of 40 to 160 mJ/cm$^2$, and the minimum laser output was defined as an optimal irradiation dose. As a result, the optimal irradiation dose was 100 mJ/cm$^2$.

[5] Debonding Property by Laser Light (355 nm) (Debonding Through Entire-Surface Irradiation)

A laminate produced in the same manner as in Example 2-1 was irradiated with laser light from the glass wafer side by means of the laser irradiation apparatus so that irradiation was performed over the entire surface of the wafer. After completion of the laser irradiation, it was determined whether or not the glass wafer was removed. In this case, the laser irradiation was performed so as to prevent overlapping in front-back and left-right directions. The laser output was adjusted to 100 mJ/cm$^2$ (i.e., optimal irradiation dose).

As a result, the glass wafer (on the carrier side) was found to be readily removed manually under application of substantially no force after the laser irradiation.

[6] Storage Stability Test of Releasing Agent Composition

Example 3-1

The releasing agent composition prepared in Example 1-1 was stored at 23° C. for one month. The composition exhibited a transmittance of light having a wavelength of 560 nm of 89% before the storage. The composition exhibited a transmittance of light having a wavelength of 560 nm of 88% after the storage; i.e., the composition underwent substantially no change in transmittance. Also, no noticeable change in appearance of the composition was determined by visual observation.

Thus, the releasing agent composition of the present invention exhibited excellent storage stability.

The invention claimed is:

1. A laminate comprising:
a first substrate formed of a semiconductor substrate;
a second substrate formed of a light-transmissive support substrate; and
an adhesive layer and a release layer disposed between the first substrate and the second substrate,
wherein the release layer is a film formed from a releasing agent composition containing a polynuclear phenol derivative represented by formula (P):

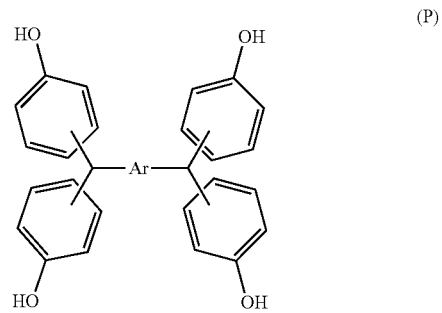

(P)

wherein Ar represents an arylene group,
a cross-linking agent, and
at least one of an acid generator and an acid.

2. The laminate according to claim 1, wherein the polynuclear phenol derivative is represented by formula (P-1):

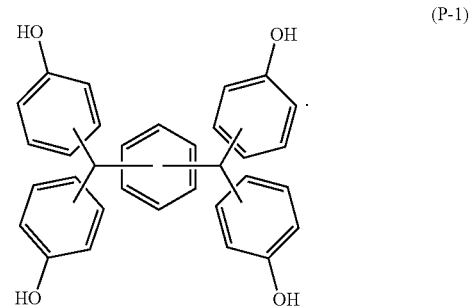

(P-1)

3. The laminate according to claim 2, wherein the polynuclear phenol derivative is represented by formula (P-1-1):

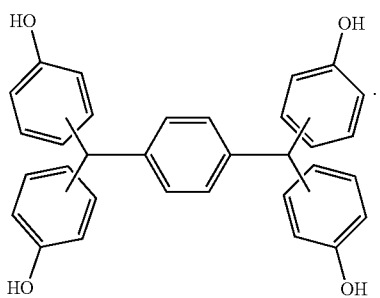
(P-1-1)

4. The laminate according to claim 3, wherein the polynuclear phenol derivative is represented by formula (P1):

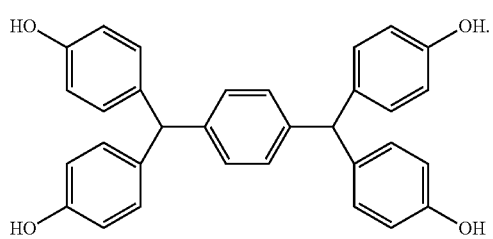
(P1)

5. The laminate according to claim 1, wherein the cross-linking agent includes at least one species selected from among a phenolic cross-linking agent having a crosslink-forming group, a melamine cross-linking agent having a crosslink-forming group, a urea cross-linking agent having a crosslink-forming group, and a thiourea cross-linking agent having a crosslink-forming group.

6. The laminate according to claim 5, wherein the cross-linking agent contains a phenolic cross-linking agent having a crosslink-forming group.

7. The laminate according to claim 1, wherein the releasing agent composition contains an acid.

8. The laminate according to claim 7, wherein the acid includes at least one species selected from among an arylsulfonic acid, an arylsulfonic acid salt, an arylcarboxylic acid, an arylcarboxylic acid salt, a chain or cyclic alkylsulfonic acid, a chain or cyclic alkylsulfonic acid salt, a chain or cyclic alkylcarboxylic acid, and a chain or cyclic alkylcarboxylic acid.

9. The laminate according to claim 1, wherein the adhesive layer is a film formed from an adhesive composition containing an adhesive component (S) containing at least one species selected from among a silicone adhesive, an acrylic resin adhesive, an epoxy resin adhesive, a polyamide adhesive, a polystyrene adhesive, a polyimide adhesive, and a phenolic resin adhesive.

10. The laminate according to claim 9, wherein the adhesive component (S) contains a silicone adhesive.

11. The laminate according to claim 10, wherein the silicone adhesive contains a polysiloxane component (A) which is cured through hydrosilylation.

12. A releasing agent composition containing a polynuclear phenol derivative represented by formula (P):

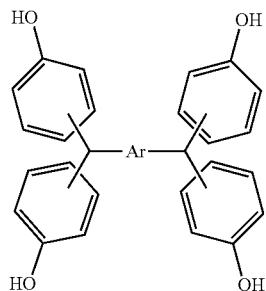
(P)

wherein Ar represents an arylene group,
a cross-linking agent, and
at least one of an acid generator and an acid.

13. The releasing agent composition according to claim 12, wherein the polynuclear phenol derivative is represented by formula (P-1):

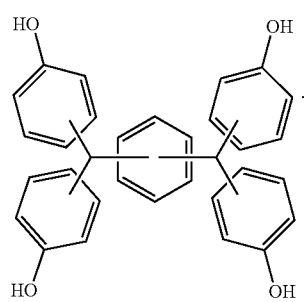
(P-1)

14. The releasing agent composition according to claim 13, wherein the polynuclear phenol derivative is represented by formula (P-1-1):

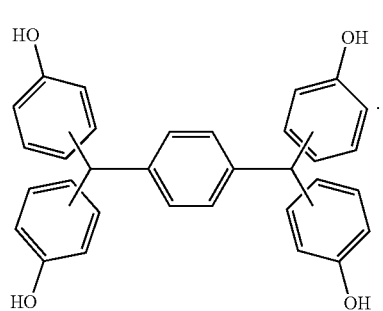
(P-1-1)

15. The releasing agent composition according to claim 14, wherein the polynuclear phenol derivative is represented by formula (P1):

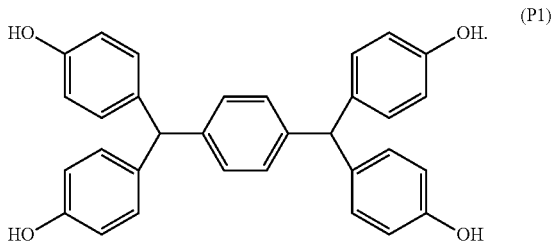 [SMILES: Oc1ccc(C(c2ccc(O)cc2)c2ccc(C(c3ccc(O)cc3)c3ccc(O)cc3)cc2)cc1]

(P1)

16. The releasing agent composition according to claim 12, wherein the cross-linking agent includes at least one species selected from among a phenolic cross-linking agent having a crosslink-forming group, a melamine cross-linking agent having a crosslink-forming group, a urea cross-linking agent having a crosslink-forming group, and a thiourea cross-linking agent having a crosslink-forming group.

17. The releasing agent composition according to claim 12, wherein the cross-linking agent contains a phenolic cross-linking agent having a crosslink-forming group.

18. The releasing agent composition according to claim 12, wherein the releasing agent composition contains an acid.

19. The releasing agent composition according to claim 18, wherein the acid includes at least one species selected from among an arylsulfonic acid, an arylsulfonic acid salt, an arylcarboxylic acid, an arylcarboxylic acid salt, a chain or cyclic alkylsulfonic acid, a chain or cyclic alkylsulfonic acid salt, a chain or cyclic alkylcarboxylic acid, and a chain or cyclic alkylcarboxylic acid.

20. The releasing agent composition according to claim 12, the releasing agent composition used for forming a release layer of a laminate, the laminate having a first substrate formed of a semiconductor substrate; a second substrate formed of a light-transmissive support substrate; and an adhesive layer and the release layer disposed between the first substrate and the second substrate.

* * * * *